United States Patent [19]

Onoda et al.

[11] Patent Number: 4,694,186

[45] Date of Patent: Sep. 15, 1987

[54] SYSTEM FOR PHOTOELECTRIC DETECTION

[75] Inventors: Ruri Onoda, Tokyo; Yoichi Kuroki, Kawasaki; Gen Nakamura, Yokohama, all of Japan

[73] Assignee: Canon Kabushiki Kaisha, Tokyo, Japan

[21] Appl. No.: 772,713

[22] Filed: Sep. 5, 1985

[30] Foreign Application Priority Data

Sep. 10, 1984 [JP] Japan .............................. 59-188083
Oct. 12, 1984 [JP] Japan .............................. 59-212605
Nov. 5, 1984 [JP] Japan .............................. 59-231405

[51] Int. Cl.$^4$ ........................ H01J 40/14; G01C 3/08
[52] U.S. Cl. ........................................... 250/578; 356/4
[58] Field of Search ............... 250/578, 214; 356/376, 356/4

[56] References Cited

U.S. PATENT DOCUMENTS 4,427,880 1/1984 Kanade et al. ...................... 250/578

Primary Examiner—Gene Wan
Attorney, Agent, or Firm—Fitzpatrick, Cella, Harper & Scinto

[57] ABSTRACT

A system for photoelectrically detecting a light reflected from an object, such as a semiconductor wafer, irradiated by a light beam supplied from a light source, wherein the amount of irradiation is controlled so as to obtain an optimum photoelectrically-converted signal. According to another aspect of the invention, the amount of irradiation is controlled automatically on the basis of a reflectance of the object which has been detected preparatively. According to another preferred form of the invention, the amount of irradiation is controlled in a time-sharing fashion so as to obtain optimum photoelectrically-converted signals from different portions of the object.

17 Claims, 24 Drawing Figures

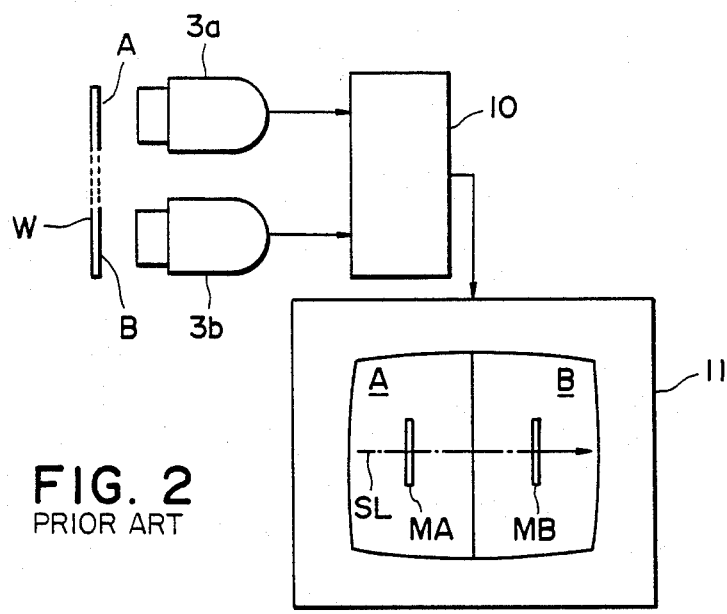
FIG. 2
PRIOR ART
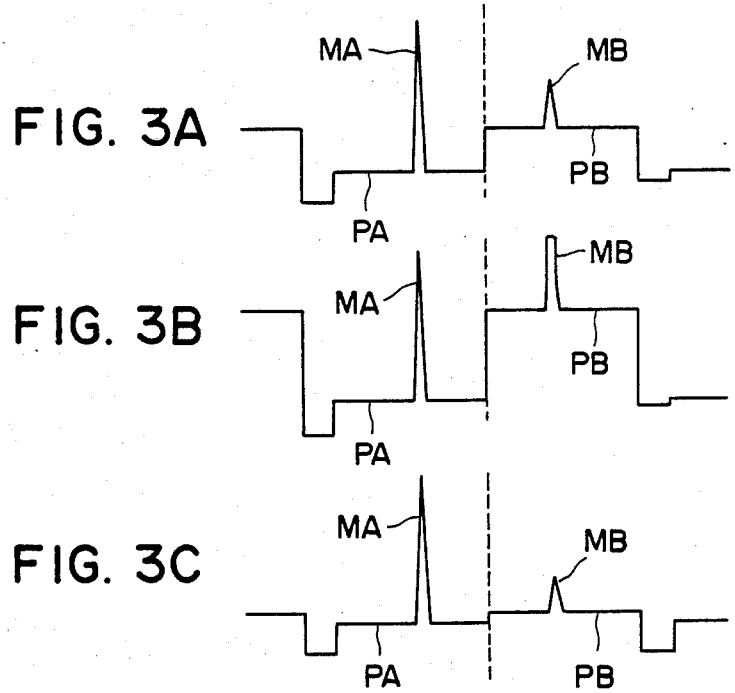
FIG. 3A
FIG. 3B
FIG. 3C

SYSTEM FOR PHOTOELECTRIC DETECTION

FIELD OF THE INVENTION AND RELATED ART

This invention relates to a system for photoelectric detection and, more particularly, to a system for photoelectrically detecting a light beam reflected from a semiconductor wafer in order to align the wafer with respect to a photomask or reticle (which hereinafter will be referred to simply as "mask") having an integrated circuit pattern, during a semiconductor manufacturing process.

In general, devices such as alignment devices, using photoelectrically detecting systems to which the present invention pertains, have an illumination source for supplying a light beam to illuminate an object such as a wafer and a light receiving system for receiving the light beam reflected from the object, an example of such devices being shown in FIG. 1. Denoted in this Figure by numeral 1 is a power source for supplying a voltage to a light source (lamp) 2 to illuminate an object (wafer) W. The device of FIG. 1 further includes a lens system 3 for receiving light R reflected from the wafer W, an image pickup tube (TV camera) 4, a camera control portion 5 and a video signal amplifier 6 for amplifying an output from the camera control portion 5. The output signal of the video signal amplifier 6 is applied to a central processing unit 9 (which hereinafter will be referred to simply as "CPU") by way of a position measuring or detecting circuit 7 on one hand and by way of a signal level detecting circuit 8 on the other hand. The CPU 9 is connected to the video signal amplifier 6 so that, on the basis of an output signal of the signal level detecting circuit 8, it controls the gain of the video signal amplifier 6, which is a gain-controllable type, so as to obtain an optimum signal level for the sake of position measurement.

In the case of apparatuses for observing a surface of an object, such as a wafer surface, the output of the video signal amplifier 6 is monitored by means of a monitoring TV receiver such as shown at 11 in FIG. 2.

In these types of devices employing the photoelectrically detecting systems, as described above, the level of a signal which is going to be detected is controlled by controlling the gain of the signal amplifier so as to obtain a positional signal whose level is within an appropriate range. Such gain control for the signal level control is executed even when the quantity of received light is extraordinarily changed due to the difference in reflectance of the objects (wafers) resulting from the difference in the material of the objects.

If, however, the wafer being examined has a high reflectance, the linearity of the gain controllable amplifier 6 would degrade due to saturation or the like. If, on the other hand, the wafer surface has a low reflectance, the detected signal would have a decreased signal-to-noise ratio (S/N ratio). In any case, the position detecting accuracy deteriorates and the image quality of the picture image displaced in the TV monitor is degraded. Further, if the intensity of light reflected from the wafer surface and thus the level of output signals from the video signal amplifier change substantially due to the difference in reflectance of the wafers resulting from the difference of the materials of the wafers or the difference of the resist materials applied onto the wafers, it requires a long time to effect feedback control, for the sake of optimization of the signal level, at the video signal amplifier or the like.

In some cases, such as shown in FIG. 2, images of different marks formed on different areas A and B of the wafer W surface are picked up by different image pickup tubes 3a and 3b and signals from these pickup tubes 3a and 3b are combined so that the images of the separate marks are displayed in a common monitor 11. Denoted in FIG. 2 by numeral 10 is a mixer for combining the output signals from the image pickup tubes 3a and 3b; and by 11 is the monitor for displaying, in accordance with the video signals supplied from the mixer 10, the images of wafer areas A and B in the left and right halves of the picture plane, respectively. Denoted by characters MA and MB are the marks formed on the wafer areas A and B, respectively; and by a character SL is a scan line along which the picture image is scanned.

In the above-described structure, and owing to the difference in electrical characteristics of the image pickup tubes 3a and 3b and/or the difference in optical characteristics of optical systems annexed to the image pickup tubes 3a and 3b, respectively, there may occur a difference in appearance of the picture portions A and B in the TV display, such as difference in brightness, difference in apparent contrast, etc.

Such phenomenon can be represented electrically in terms of difference in video signals, as shown in FIGS. 3A–3C.

In FIG. 3A, the level of the signal MB corresponding to the mark MB of FIG. 2 is lower than that of the signal MA corresponding to the mark MA of FIG. 2, whereas the pedestal PB corresponding to the right half of the picture plane differs substantially from the pedestal PA corresponding to the left half of the picture plane. In FIG. 3B, the signal level MB corresponding to the mark MB of FIG. 2 is saturated and the pedestal PB is very high. In FIG. 3C, the signal level MB corresponding to the mark MB of FIG. 2 is very low as compared with the signal level MA corresponding to the mark MA of FIG. 2, while pedestals PA and PB are approximately equal to each other.

Conventionally, such difference in appearance of the picture image portions A and B is corrected by controlling the gain of the amplifier or the like relative to the output signals of the image pickup tube 3a or of the image pickup tube 3b. Such gain control is however disadvantage since, as described in the foregoing, the signal-to-noise ratio becomes very poor where the signal level is low. Additionally, it is not possible to equalize the entire signal level (including the level of pedestal) of the video signal corresponding to picture image portion A with that of the video signal corresponding to the picture image portion B, although it may be possible to equalize the peak levels or average levels of these video signals. While the pedestal of each video signal may be cut out prior to the gain control, this is not preferable since, if the signal level is low, noises may be mixed into the video signal when it is processed by the circuit for cutting the pedestal, or the signal level is further decreased which leads to further degradation of the signal-to-noise ratio.

It is possible to control the gain relative to each of the outputs from the image pickup tubes 3a and 3b, independently from the other. It requires, however, plural gain control circuits each as shown in FIG. 1, which disadvantageously results in a complicated structure.

SUMMARY OF THE INVENTION

It is accordingly a primary object of the present invention to provide a system for photoelectric detection, by which an optimum photoelectrically-converted signal is obtainable.

It is another object of the present invention to provide a system for photoelectric detection, by which only an optimum photoelectrically-converted signal is outputted to a signal processing system connected to the photoelectric detection system.

It is a further object of the present invention to provide a system for photoelectric detection, by which an optimum photoelectrically-converted signal is obtainable regardless of the difference in reflectance of objects to be examined.

It is a still further object of the present invention to provide a system for photoelectric detection, by which optimum photoelectrically-converted signals are obtainable from different portions of an object to be examined.

Briefly, according to the present invention, there is provided a system for photoelectrically detecting a light reflected from an object, such as a semiconductor wafer, irradiated with a light beam supplied from a light source, wherein the amount of irradiation is controlled so as to obtain an optimum photoelectrically-converted signal.

According to one preferred form of the invention, the amount of irradiation is controlled automatically on the basis of a reflectance of the object which has been detected preparatively.

According to another preferred form of the invention, the amount of irradiation is controlled in a time-sharing fashion so as to obtain optimum photoelectrically-converted signals from different portions of the object.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 2 is a schematic and diagrammatic view showing an example of known type photoelectrically detecting system which includes plural image pickup tubes.

FIGS. 3A–3C are waveform views showing examples of video signals produced by the system of FIG. 2.

DESCRIPTION OF THE PREFERRED EMBODIMENTS

Figure 4:
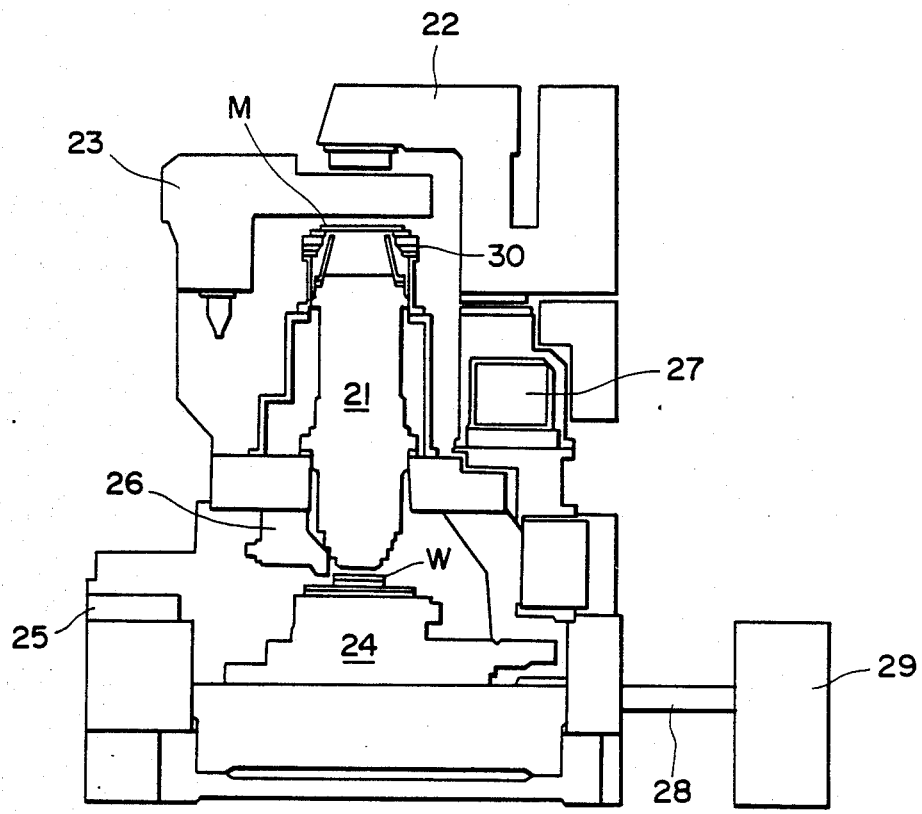
FIG. 4 is a front view schematically showing a projection exposure apparatus for use in the manufacture of semiconductor devices, in which apparatus a system for photoelectric detection according to the present invention is incorporated.

Referring now to FIG. 4, there is shown a projection exposure apparatus for use in the manufacture of semiconductor devices such as integrated circuits. The apparatus includes a projection lens 21 for projecting, in a reduced scale, an integrated circuit pattern of a mask M onto a semiconductor wafer W. An illumination system 22 produces a light of a predetermined wavelength (e.g. g-line or i-line) to illuminate the mask M. By this illumination, the wafer W is exposed to the light passed through the mask M, so that the integrated circuit pattern of the mask M is transferred onto the wafer W.

First, the wafer W is conveyed from an unshown wafer cassette to a prealignment stage 25 whereat it is mechanically prealigned on the basis of its outer peripheral shape. Then, the wafer W is conveyed by an unshown hand to a wafer stage 24. The stage 24 is movable along a plane which is perpendicular to the optical axis of the lens 21 so as to achieve fine alignment of the wafer W with respect to the mask M. By this fine alignment of the wafer W, the wafer W is positioned exactly at the exposure station. Various operations of the exposure apparatus itself are controlled in response to signals supplied thereto by a cable 28 from a control box 29 having an central processing unit (not shown) and an control circuit (also, not shown). The alignment of the mask M and the wafer W through the projection lens 21 (i.e. the TTL alignment) is effected by scanning, with a laser beam supplied from a laser source 27, the mask M and the wafer W located at the exposure station and by detecting with a TTL alignment scope 23 the laser beam reflected from the mask M and the wafer W. On the other hand, the alignment of the wafer W through a TV monitor (which is called an "off-axis alignment") is effected by detecting with an off-axis alignment scope 26 the light reflected from the wafer W which is illuminated by a light source of the off-axis alignment system. Denoted in FIG. 4 by numeral 30 is a stage for holding the mask M.

Details of the arrangement of the off-axis alignment scope 26 shown in FIG. 4 will be described with reference to FIG. 5. Denoted in this Figure by character M is the mask, by character W is the wafer, and by numeral 21 is the projection lens. The wafer W is movable by the wafer stage 24 from a solid-line position (off-axis alignment position) to a broken-line position (exposure position) which is the position at which the pattern of the mask M is projected onto the wafer W through the projection lens 21. The wafer W is coated with a photoresist layer and has a prealignment mark of predetermined shape formed at a predetermined position thereon.

The off-axis alignment scope 26 includes an objective lens 40; an image pickup tube or a solid image-pickup device 50; an illumination source 45 such as, for example, a halogen lamp; a condenser lens 44; a relay lens 42 for illumination; and a cemented prism 41 which has an internal reflection surface 41a and a semitransparent reflection surface 41b. The light source 45, the condenser lens 44, the relay lens 42, the cemented prism 41 and the objective lens 40 constitute an illumination system. The light beam emerging from the objective lens 40 is perpendicularly incident on the wafer W. The off-axis alignment scope 26 further includes a relay lens 46; a mirror 47 for deflecting the optical path; a glass plate 48; and an image-pickup lens 49. These elements, in co-operation with the cemented prism 41 and the image pickup tube 50, constitute a light-receiving system. In this respect, the cemented prism 41 functions to combine the optical axis of the illumination system with the optical axis of the light-receiving system.

The light beam reflected from the wafer W and passed through the objective lens 40 is reflected by both the internal reflection surface 41a and the semitransparent reflection surface 41b of the cemented prism 41 and, then, is reflected again by the internal reflection surface 41a toward the relay lens 46. In this manner, an image of the prealignment mark of the wafer W is once formed on the glass plate 48 and then is focused on the image-pickup surface of the image pickup tube 6. Denoted in FIG. 5 by numerals 43a and 43b are a bright-field aperture stop and a dark-field aperture stop, respectively, which are interchangeably disposed between the lenses 42 and 44. In the state of FIG. 5, the bright-field aperture stop 43a is disposed on the optical path.

Figure 5:
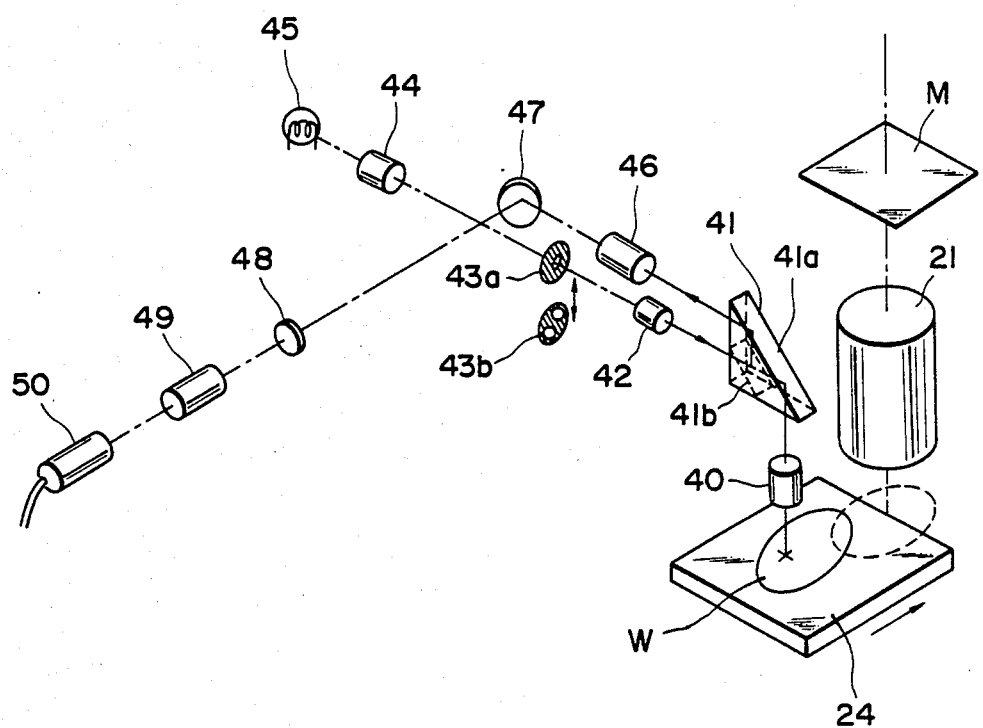
FIG. 5 is a schematic view of an alignment system employed in the FIG. 4 apparatus.
Figure 6:
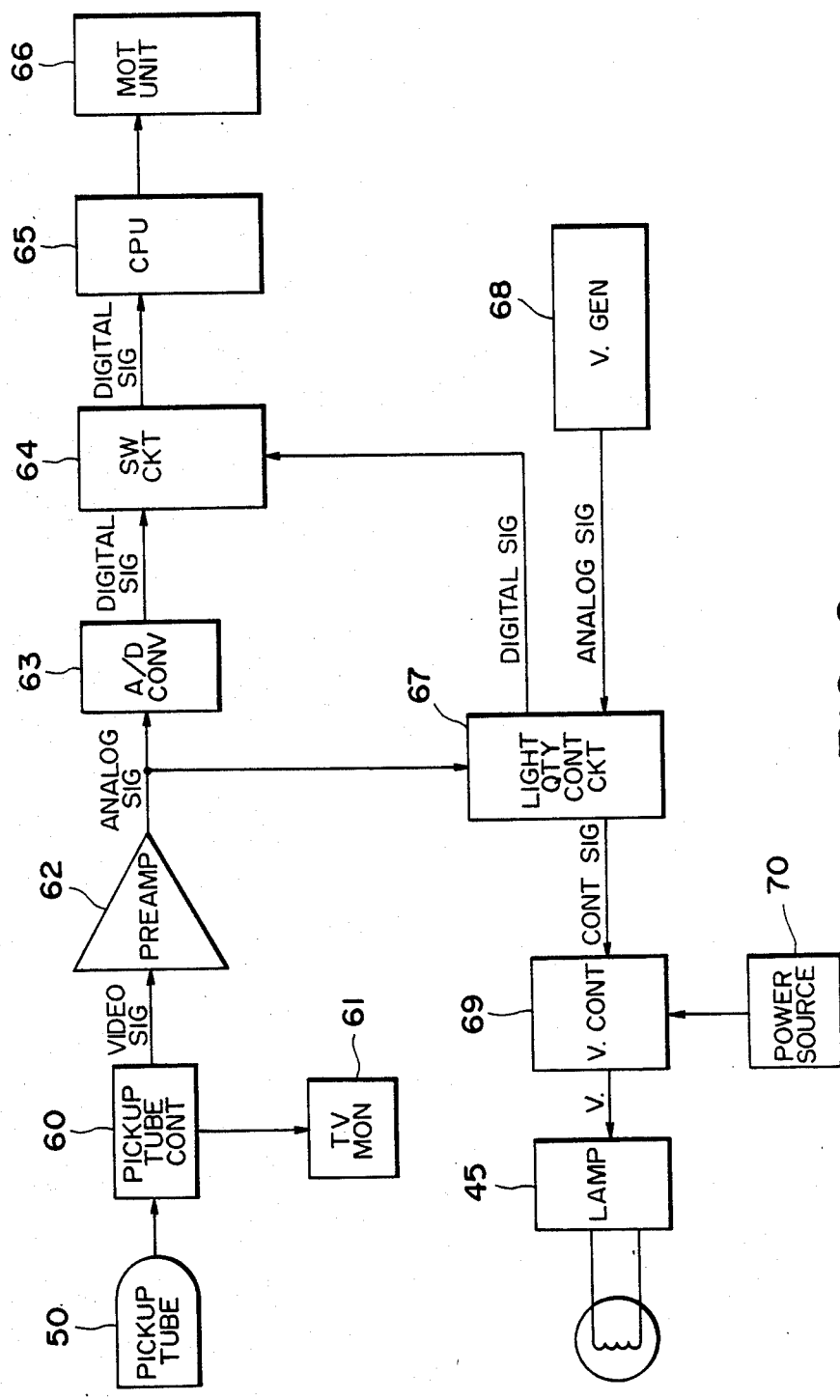
FIG. 6 is a diagram showing a system for photoelectric detection, according to a first embodiment of the present invention.

FIG. 6 shows a system for photoelectric detection, according to one embodiment of the present invention, which is incorporated in the off-axis alignment device of FIG. 5.

As shown in FIG. 6, the photoelectric detection system includes an image pickup tube 50 as aforesaid; a pickup tube control circuit 60 for transforming an electric signal produced by the image pickup tube 50 into a video signal; a TV monitor 61 for displaying an image of the object being examined (i.e. the prealignment mark area of the wafer W) picked up by the image pickup tube 50; a preamplifier 62 for amplifying, at a predetermined amplification rate, the weak video signal outputted from the control circuit 60; an analog-to-digital converter 63 (hereinafter the "A/D converter") for converting an analog signal outputted from the preamplifier 62 into a digital signal; a switch circuit 64 which is arranged to operate after it has discriminated that the level of the output signal from the preamplifier 62 is substantially equal to a predetermined level which has been set for the purpose of later signal processing; and a central processing unit 65 (which hereinafter the "CPU") for processing a digital signal supplied thereto from the switch circuit 64 and for controlling the other units of the apparatus. In addition, the photoelectric detection system further includes a light-quantity control circuit 67 adapted to transform an output signal from the preamplifier 62 into a control signal; a motor unit 66 adapted to be controlled by an output signal supplied thereto from the CPU 65 to drive, for example, the wafer stage 24 for the sake of the prealignment of the wafer W; a voltage generator 68 for producing a reference voltage to be used in the comparison, at the light-quantity control circuit 67, with the output signal of the preamplifier 62; a voltage control circuit 69 for adjusting the voltage to be applied to the lamp 45, in accordance with the control signal supplied thereto from the light-quantity control circuit 67; and a power source 70 for supplying a power to the voltage control circuit 69.

The operation will now be described first in conjunction with FIG. 5 and then in conjunction with FIG. 6. In FIG. 5, the light emitted from the lamp 45 passes through the condenser lens 44 and the field aperture stop 43a or 43b. Then, the light passes through the relay lens 42, the cemented prism 41 and the objective lens 40, so that it is perpendicularly incident on the wafer W. The light reflected by the wafer W surface goes back along its oncoming path and enters again into the cemented prism 41. By this cemented prism 41, the light is deflected so that it is passed through the relay lens 46, reflected by the mirror 47, passed through the glass plate 48 and the image-pickup lens 49 and finally is introduced into the image pickup tube 50. The image pickup tube 50 thus produces an electric signal having a level corresponding to the quantity of light received. In FIG. 6, the electric signal produced by the image pickup tube 50 is applied to the control circuit 60 by which it is transformed into a video signal. The control circuit 60 supplies the video signal to each of the TV monitor 61 and the preamplifier 62. The preamplifier 62 amplifies the thus inputted video signal at a predetermined amplification rate. The output of the preamplifier 62 in the form of an analog signal is applied to each of the A/D converter 63 and the light-quantity control circuit 67. Within the light-quantity control circuit 67, the analog signal outputted from the preamplifier 62 is compared with the reference voltage level outputted from the voltage generator 68 and representing the optimum signal level for the sake of later signal processing. Then, the light-quantity control circuit 67 produces a control signal in accordance with the difference, in the voltage level, of the two input signals. At the same time, the light-quantity control circuit 67 discriminates whether or not any control signal is being outputted, namely, whether the adjustment of the light quantity is being currently effected or the adjustment of the light quantity has been accomplished so that the lamp 45 stably supplies a constant amount of light, and produces a digital signal representing the result of discrimination which signal is applied to the switch circuit 64. The control signal outputted from the light-quantity control circuit 67 is applied to the voltage control circuit 69. Then, the voltage control circuit 69 changes the voltage supplied thereto from the power source 70, in accordance with the control signal applied thereto from the light-quantity control circuit 67, and supplies the thus controlled voltage to the lamp 45. By such control of the supply voltage, the quantity of light to be emitted by the lamp 45 is adjusted. On the other hand, the analog signal outputted from the preamplifier 62 is converted by the A/D converter 63 into a digital signal which is applied to the switch circuit 64, as described in the foregoing.

In general, the operation for adjusting the quantity of light is performed within a period of time on the order of $10^{-2}$ sec. In view of the operation time or the like of the CPU 65, however, there is a possibility that the signal processing is executed relative to such signals whose levels are not constant due to a varying amount of irradiation. In order to obviate such phenomenon, the photoelectric detection system according to this embodiment of the present invention is arranged such that the switch circuit 64 discriminates, on the basis of the output signal from the light-quantity control circuit 67, whether or not the digital signals outputted from the A/D converter 63 are stable at an appropriate signal level, and that the switching circuit 64 transmits the digital signals from the A/D converter 63 to the CPU 65 only when these digital signals are stable. The CPU 65 processes the thus supplied digital signal and outputs, to the motor unit 66, a signal for driving the wafer stage 24 for the sake of the off-axis alignment.

Figure 7A:
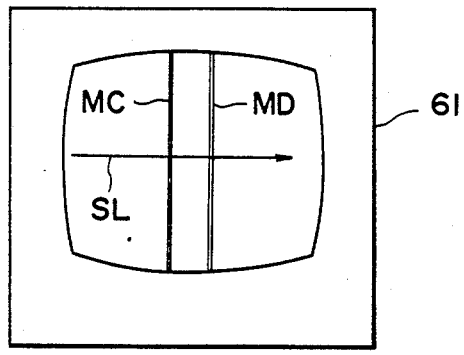
FIG. 7A is a schematic view showing a display in a TV monitor used in the first embodiment.
Figure 7B:
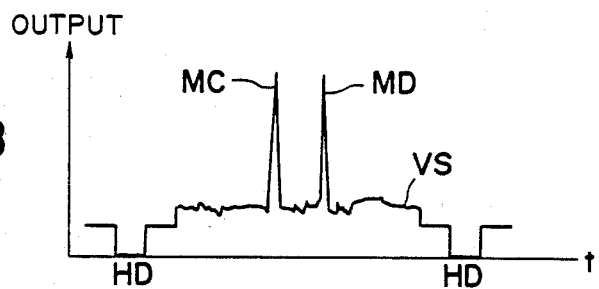
FIGS. 7B–7D are waveform views showing video signals applied to the TV monitor of FIG. 7A.
Figure 7C:
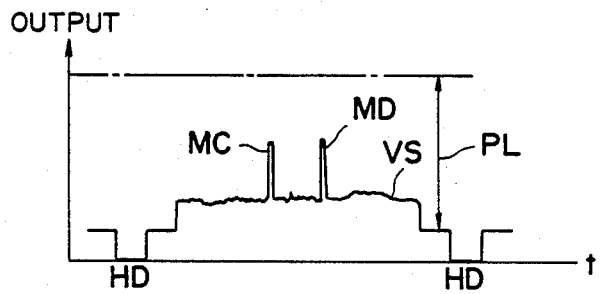
Figure 7D:
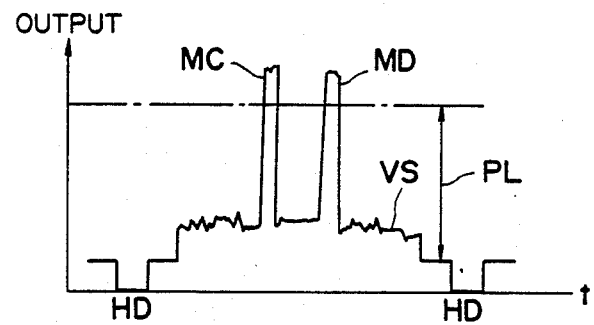

As has been described with reference to FIG. 5, the alignment mark (off-axis alignment mark) formed on the wafer W is illuminated by the light emitted from the lamp 45 and, then, the light reflected by the wafer W surface is received by the image pickup tube 50. As the result, the TV monitor 61 (FIG. 6) displays an image of the alignment mark area of the wafer W surface, such as shown in FIG. 7A. Denoted in this Figure by characters MC and MD are the edges of the alignment mark, respectively; and by SL is the scan line along which the image of the picture plane is scanned. Depending on the reflectance or other surface conditions of the wafer W, the scan of the picture image produces various electric signals such as shown in FIGS. 7B–7D. In each of these Figures, character VS denotes the video signal, while character PL denotes a favorable peak signal level.

Figure 1:
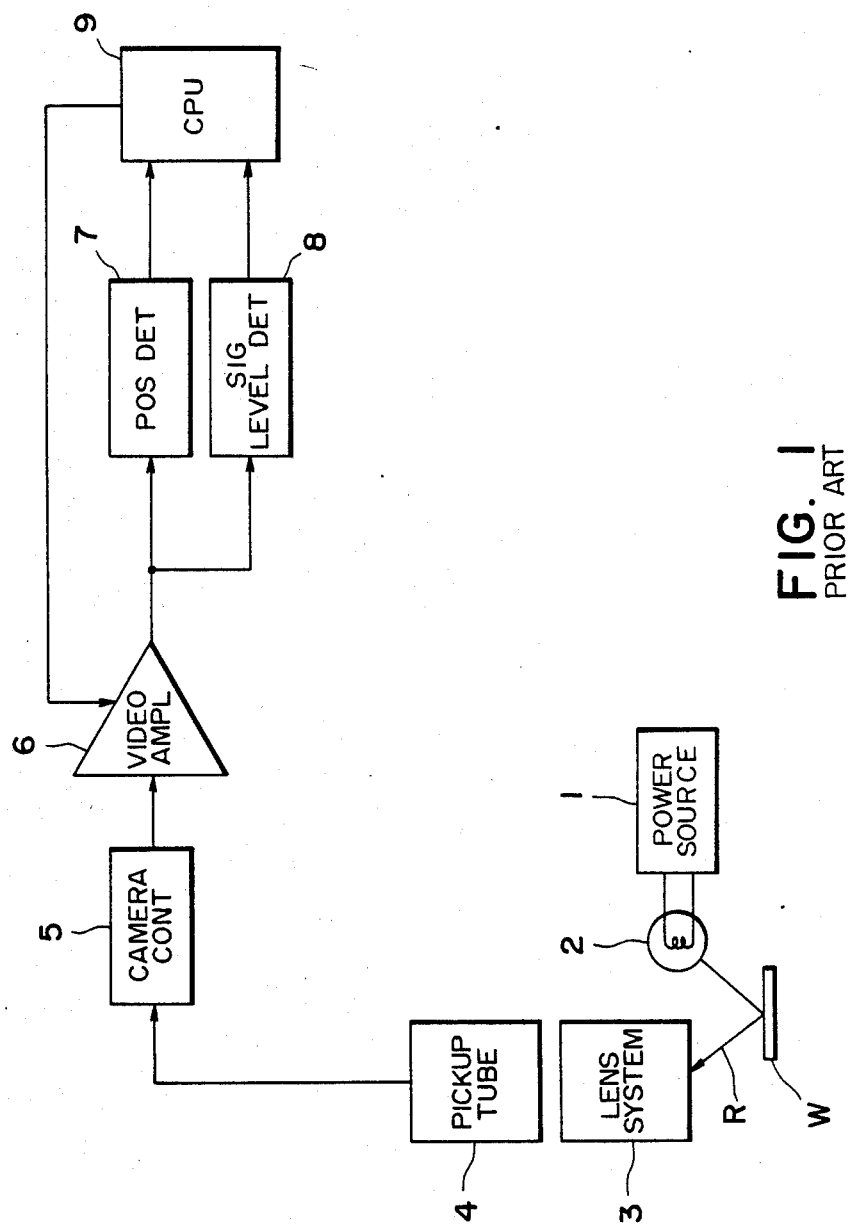
FIG. 1 is a schematic and diagrammatic view showing an example of known type photoelectrically detecting system.

FIG. 7B shows the case where the electric signal has a favorable level. Such electric signal will, however, be changed due to the change in reflectance of the wafer W or the deterioration with age of the light source 45, such as shown in FIG. 7C or 7D. According to this embodiment of the present invention, however, it is possible to control the state of signal detection so that, for the conditions resulting in unfavorable signal waveforms of FIGS. 7C and 7D, a satisfactory waveform such as shown in FIG. 7B is obtained, without the use of any automatic gain control circuit or any amplifier having variable gain, such as shown in FIG. 1. As the result, the signal to be transmitted to the CPU 65 can be optimized without any degradation of the signal-to-noise ratio. Additionally, the provision of the switch circuit 64 according to this embodiment is effective to prevent any unstable signal from being processed, which signal is produced when the amount of irradiation is being changed during execution of the adjustment of the quantity of irradiation.

Figure 8:
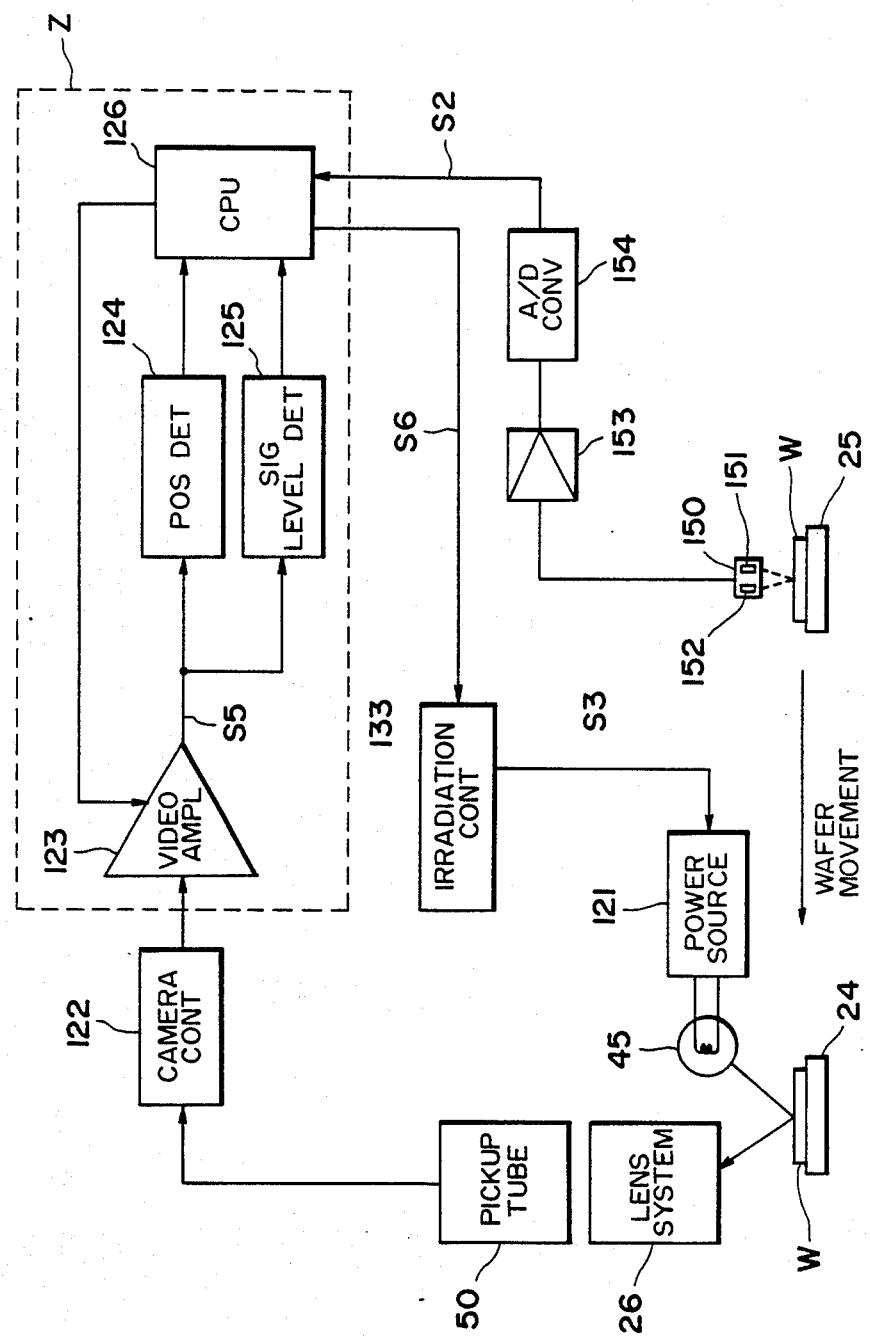
FIG. 8 is a schematic and diagrammatic view showing a system for photoelectric detection, according to a second embodiment of the present invention.

FIG. 8 shows a system for photoelectric detection, which is applicable to the alignment device shown in FIG. 5.

Denoted in FIG. 8 by numeral 26 is an objective lens for receiving a reflection light R from the wafer W; 50, is an image pickup tube; 122, is a camera control portion connected to the image pickup tube 50 to transform an electric signal outputted from the image pickup tube into a video signal; and 123, is a video amplifier for amplifying the video signal from the camera control portion 122. An output signal S5 of the video amplifier 123 is applied to each of a position detecting circuit 124 and a signal level detecting circuit 125.

When, in the projection exposure apparatus of FIG. 4, the wafer W conveyed onto the prealignment stage 25 is being subjected to the mechanical prealignment, the photoelectric detection system shown in FIG. 8 measures the reflectance of the wafer W surface. More particularly, the system includes a wafer reflectance measuring sensor 150 having a light emitting diode 151 and a photo-transistor 152. During the mechanical prealignment of the wafer W, the light emitting diode 151 emits a light to illuminate the wafer W, and the light reflected by the wafer W surface is received by the photo-transistor 152. The photo-transistor 152 converts the received light into an electric signal which is then amplified by an amplifier 153. An output signal of the amplifier 153 is converted, into a digital signal, by an analog-to-digital converter 154 (hereinafter the "A/D converter"). The thus obtained digital signal S2 is applied to a central processing unit 126 (hereinafter the "CPU"). In accordance with the level of the digital signal S2, the CPU 126 produces a control signal S6 which is supplied to an irradiation-amount control circuit 133. On the basis of the thus supplied control signal S6, the irradiation-amount control circuit 133 controls an output voltage of a power source 121 to thereby control the amount of irradiation from a light source (halogen lamp) 45.

If the wafer W is coated with a material of high reflectance, such as aluminum, the digital signal S2 outputted from the A/D converter 154 has a high level. Therefore, when the wafer W having been prealigned at the prealignment stage 25 is moved to the wafer stage 24 for the sake of TV prealignment, such control signal S6 which, in this case, corresponds to the digital signal S2 of high level is produced by the CPU 126 and is applied to the irradiation-amount adjusting circuit 133. By this, the output of the power source 121 and therefore the amount of irradition of the light source 45 are adjusted so as to supply a lower amount of light. In this embodiment of the present invention, the video amplifier 123, the position detecting circuit 124 and the signal level detecting circuit 125 have substantially the same functions as of the video amplifier 9, the position detecting circuit 7 and the signal level detecting circuit 9 shown in FIG. 1.

The advantageous effects of this embodiment will now be described in detail in conjunction with FIG. 9.

Figure 9:
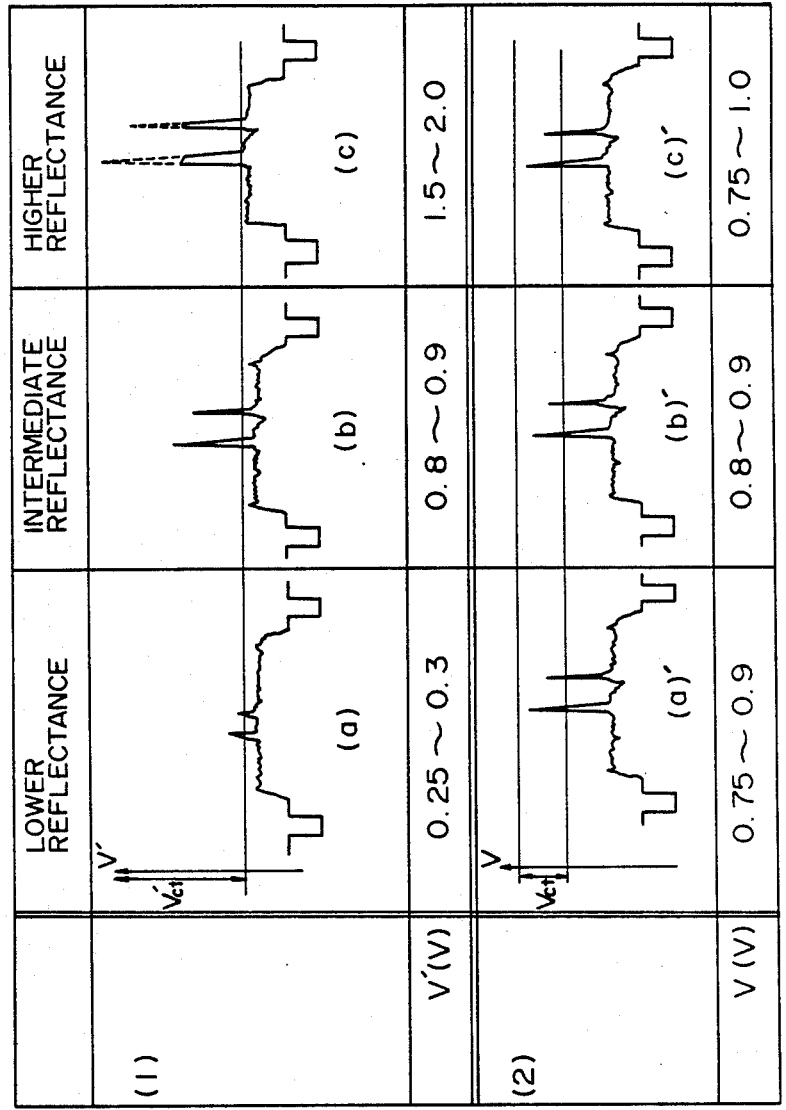
FIG. 9 shows output signals produced, by the second embodiment, for different objects having different reflectances, in comparison with output signals produced by the FIG. 1 arrangement.

FIG. 9 shows output signals of the video amplifier 123 relative to three kinds of wafers having different reflectances, when the gain of the video amplifier 123 is maintained at a fixed level. More particularly, the upper part (1) of FIG. 9 shows waveforms of the output signals of the video amplifier 123 when the system is arranged in a known manner, such as shown in FIG. 1. The waveform (a) is one obtained from a wafer of lower reflectance, the waveform (b) is one obtained from a wafer of intermediate reflectance and the waveform (c) is one obtained from a wafer of higher reflectance. Each of the waveforms (a)–(c) corresponds to a video signal of one horizontal scan period. As regards the waveform (c), it should have very high peaks such as shown by broken lines, because the wafer has a higher reflectance. Due to voltage saturation, however, the peaks of the actually produced waveform are cut, such as depicted by solid-line peaks in this waveform.

In any case, it is desired that the input level V', computed in terms of the video signal S5, is within a range of 0.8–0.9 V (peak-to-peak value), such as the case of the waveform (b). Therefore, the video amplifier 123 should have an eight times gain controllable range Vct' relative to the input range V' varying from 0.25 V to 2.0 V.

Such wide gain controllable range Vct' can be narrowed, according to this embodiment of the present invention. That is, the lower part (2) of FIG. 9 shows output signals of the video amplifier 123 when the system is arranged, according to the present invention, to control the amount of irradiation on the basis of the result of preparative measurement of the reflectance of each wafer W effected during the mechanical prealignment of the wafer W. More particularly, as regards the wafer of lower reflectance, the digital signal S2 of low level, in this case, is supplied from the A/D converter 154 to the CPU 126, such that the amount of irradiation is increased. This assures an input range V of the video amplifier 123, varying from 0.75 V to 0.9 V as shown in the part (a') of FIG. 9, which range is three times as large as the input range V' of the case of the waveform (a), varying from 0.25 V–0.3 V. As regards the wafer of higher reflectance, the digital signal S2 of high level, in this case, is supplied from the A/D converter 154 to the CPU 126. Accordingly, the amount of irradiation is decreased. This assures an input range V of the video amplifier 123, varying from 0.75 V to 1.0 V as shown in the part (c') of FIG. 9, which range is a half of the input range V' in the case of the waveform (c), varying from 1.5 V to 2.0 V. On the other hand, with regard to the wafer of intermediate reflectance, the digital signal S2 of intermediate level, in this case, is supplied from the A/D converter 154 to the CPU 126, but it does not change the amount of irradiation since the input level is inherently within a range of 0.8–0.9 V. As a result, the input range V of the video amplifier 123 for the wafer of intermediate reflectance is the same as that in the case of the waveform (b).

In this manner, the adjustment of the amount of irradiation in accordance with the information on the wafer reflectance obtained from the wafer reflectance measuring means achieves substantial reduction of the gain controllable range Vct to a 1.3 times range varying from 0.75 V to 1.0 V, which range is one sixth (1/6) of the gain controllable range required in the system arranged in the known manner. With such limited gain-controllable range, the hardware control through the block Z in FIG. 8 effectively optimizes, in a significantly reduced time, the output level of the video signal for the sake of wafer alignment.

Figure 10:
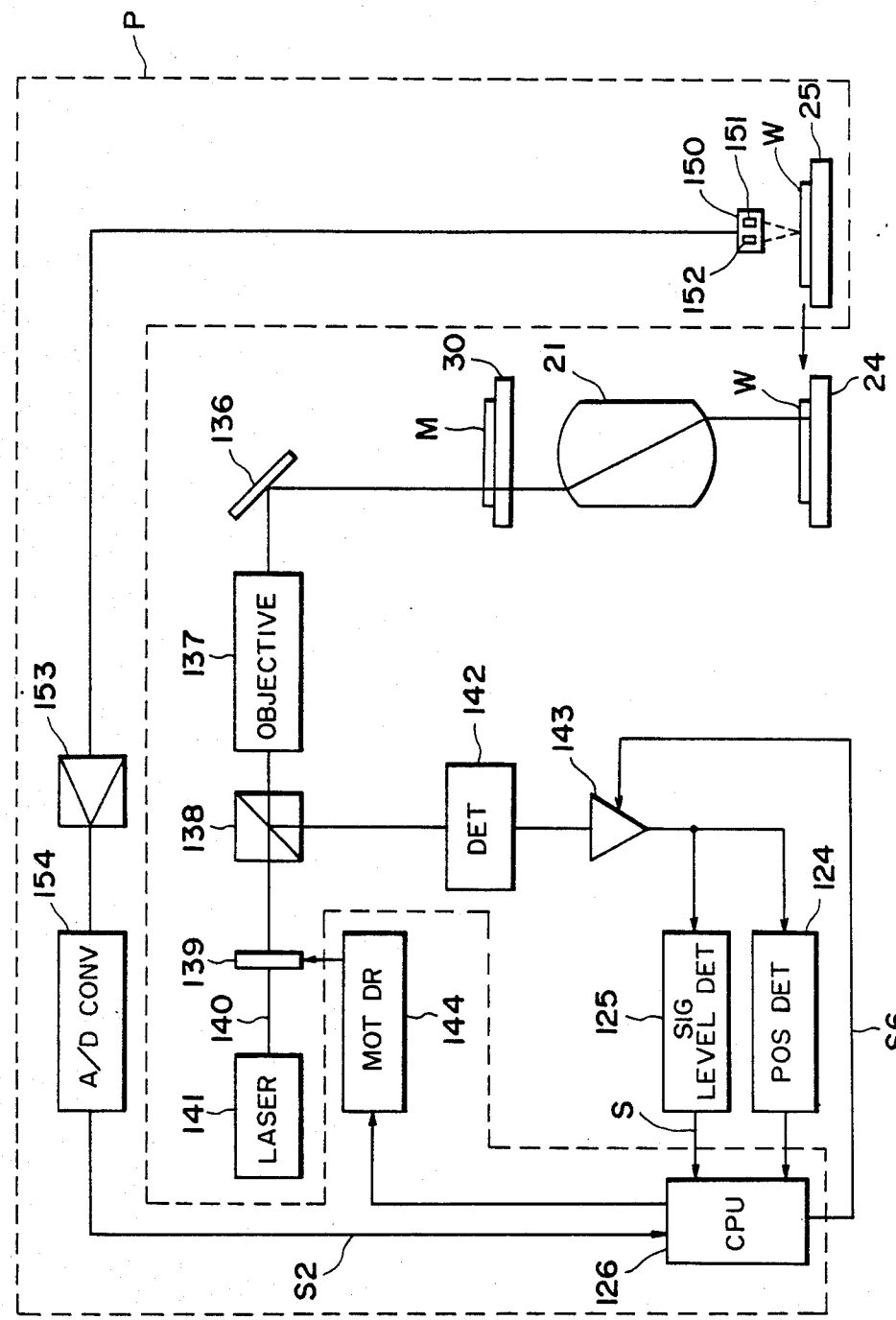
FIG. 10 is a schematic and diagrammatic view showing a system for photoelectric detection, according to a third embodiment of the present invention.

FIG. 10 shows a system for photoelectric detection, according to another embodiment of the present invention which embodiment is incorporated in the TTL alignment scope 23 of the FIG. 4 apparatus.

Figure 11:
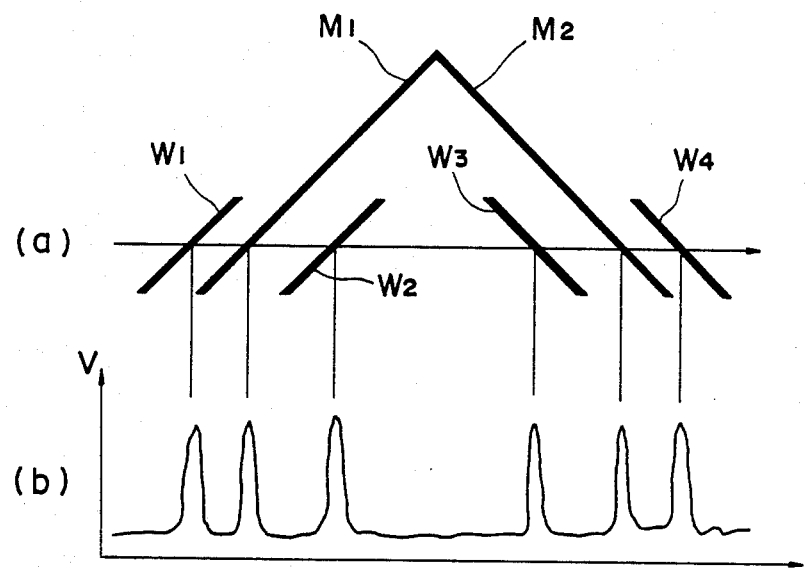
FIG. 11 shows an example of a combination of alignment marks for use in the alignment of a semiconductor wafer with respect to a mask having an integrated circuit pattern and a signal waveform obtained by scanning the alignment marks.

As shown in FIG. 10, an alignment beam 140 emitted from an illumination source 141 such as a laser passes through a polarizing plate 139 and, after passed through a beam splitter 138 and an objective lens 137, is reflcted by a mirror 136 which is detachably disposed on the illumination path. The alignment beam 140 reflected by the mirror 136 is incident on a predetermined area of a mask M held by a mask holder 30. In the predetermined area of the mask M, such marks M1 and M2 as shown in FIG. 11 are formed for the sake of position detection with respect to a wafer W. The alignment beam 140 passed through the mask M is incident, by way of a projection lens 21, on a predetermined area of the wafer W, in which area such marks W1, W2, W3 and W4 as shown in FIG. 11 are formed for the sake of position detection with respect to the mask M. The light beam reflected from the mark area of the wafer W goes back along its oncoming path, passing through the projection lens 21. When the reflected alignment beam reaches the beam splitter 138, it is deflected thereby and is directed to a detector 142 for detecting any relative positional deviation between the mask M and the wafer W.

In this embodiment of the present invention, the adjustment of the amount of irradiation is effected by changing the transmission factor of the polarizing plate 139 by rotating it through a motor 144. The amount of drive of the motor 144 necessary for optimizing the amount of irradiation to the mask M and the wafer W can be determined in the following manner:

That is, when the wafer W is conveyed onto the prealignment stage 25 for the sake of mechanical prealignment thereof, a light emitting diode 151 of a wafer reflectance measuring sensor 150 emits a light to illuminate the wafer W, and the light reflected by the wafer W surface is received by a photo-transistor 152 of the wafer reflectance measuring sensor 150. The light received by the photo-transistor 152 is photoelectrically converted thereby into an electric signal which, after being amplified by an amplifier 153 is applied to an analog-to-digital converter 154 (hereinafter the "A/D converter"). By this A/D converter 154, the output signal of the amplifier 153 is converted into a digital signal S2 which is then applied to a central processing unit 126 (hereinafter the "CPU"). In accordance with the level of the digital signal S2 applied thereto, the central processing unit 126 produces a control signal S6 which is inputted to the motor driving circuit 144. Thus, in accordance with the control signal S6, the motor driving circuit 144 rotates the polarizing plate 139 to an angle accomplishing the optimum amount of irradiation.

As described, FIG. 11 shows, particularly at the upper part (a) thereof, the position detecting marks formed on the mask M and the wafer W. Also shown in this Figure, particularly at the lower part (b) thereof, is a signal waveform outputted from a signal level detecting circuit 125 (FIG. 10), correspondingly to the position detecting marks M1, M2, W1–W4.

Figure 12:
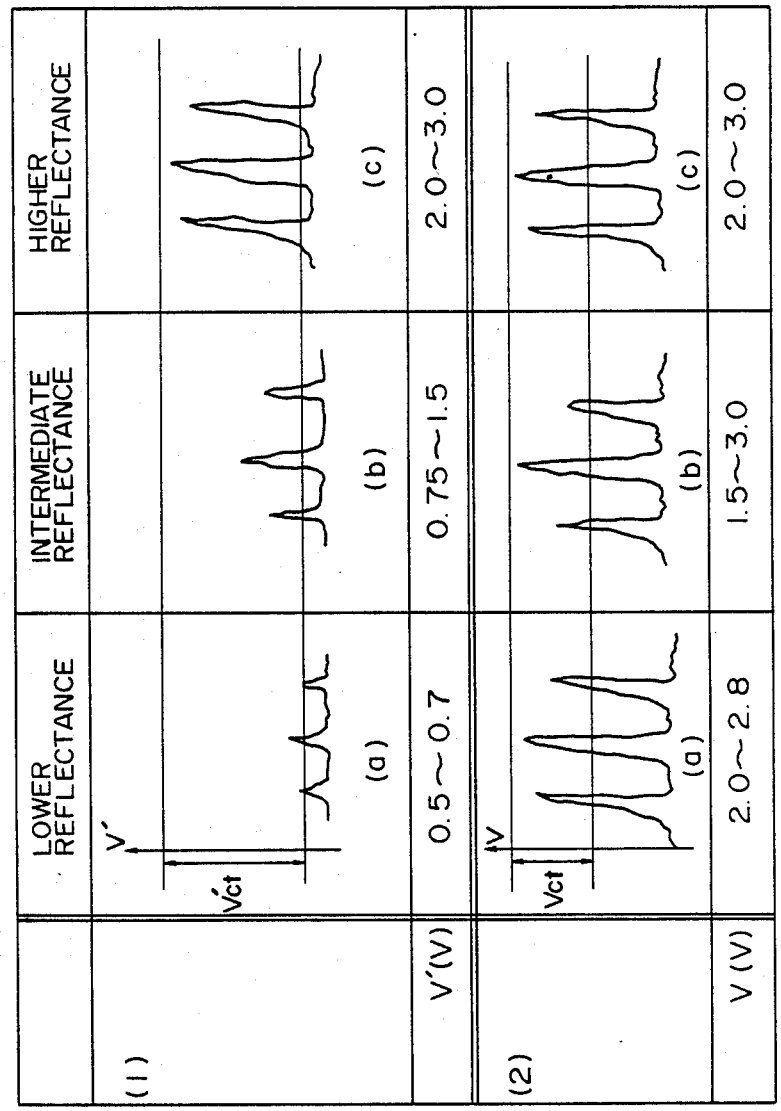
FIG. 12 shows output signals produced, by the third embodiment, for different objects having different reflectances, in comparison with output signals produced by the FIG. 1 arrangement.

Referring now to FIG. 12, the upper part (1) of this Figure shows output ranges V' and output waveforms, for three kinds of wafers having different reflectances, of the electric signals S produced from the signal level detecting circuit 125 (FIG. 10), but when the control of the amount of irradiation according to this embodiment is not effected. The wafeform (a) is one obtained from a wafer of lower reflectance, the waveform (b) is one obtained from a wafer of intermediate reflectace and the waveform (c) is one obtained from a wafer of higher reflectance. In any case, however, it is desired that the output signal level of the detecting circuit 125 is within a range of 2.0–3.0 V. Therefore, the amplifier 143 (FIG. 10) should have a six times gain-controllable range Vct' relative to the output range V' varying from 0.5 V to 3.0

V, the gain control being responsive to the control signal S6 from the CPU 126.

As compared therewith, the lower part (2) of FIG. 12 shows output ranges V and output waveforms of the signals S outputted from the signal level detecting circuit 125, when the amount of irradiation is controlled by the polarizing plate 139 co-operative with the wafer reflectance measuring means (broken-line block P), according to this embodiment. The total output range V of the electric signal S is from 1.5 V to 3.0 V, so only a "double" gain-controllable range Vct is required, which range is one third ($\frac{1}{3}$) of that required when the control of irradition is not effected. With such limited gain-controllable range, the hardware control at the amplifier 143 effectively optimizes, in a significantly reduced time, the output signal level for the sake of wafer alignment.

In accordance with this embodiment of the present invention, as has been described in the foregoing, the reflectance of the wafer is measured prior to the signal detection (e.g. at the time of wafer prealignment) and the amount of irradiation such as the quantity of light to be incident on the mask and the wafer for the sake of alignment therebetween is controlled in accordance with the result of measurement of the reflectance of the wafer, the control of irradiation being effected on the side of the illumination system of the signal detecting system. This allows reduction of the necessary range of hardware control relative to the detected signal outputted from the reflection light detecting means and assures optimization of the level of the position detecting and observing signal. Also, the time required for the feedback control for the sake of such optimization, which time has been of an order of 0.7 seconds without the present invention, can be significantly reduced to an order of 0.1 seconds.

Figure 13:
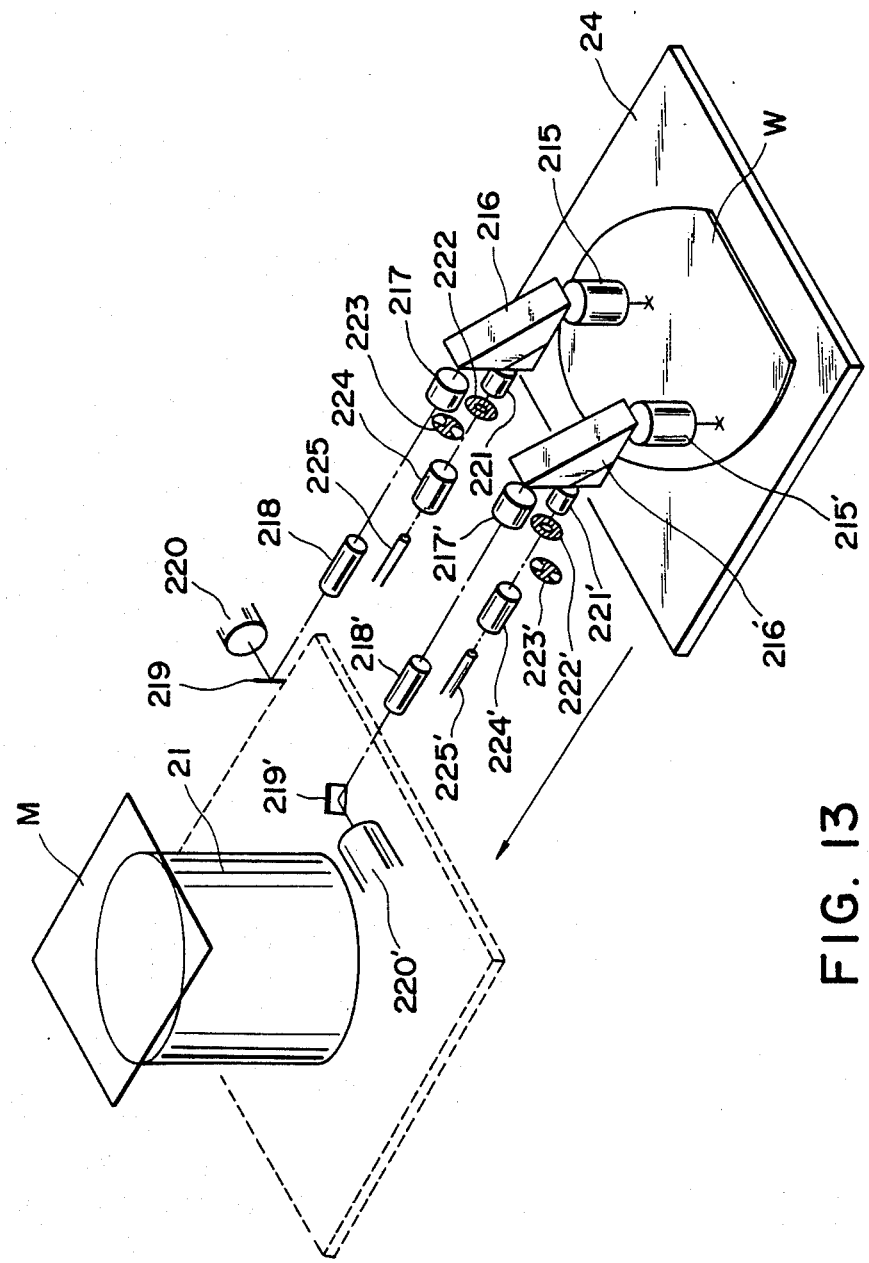
FIG. 13 is a schematic view showing another alignment system employed in the exposure apparatus of FIG. 4.

Referring now to FIG. 13, another embodiment of the present invention will be described. According to this embodiment, the amount of irradiation can be controlled relative to each of plural areas of the same wafer independently from the other.

FIG. 13 shows another form of the off-axis alignment scope 26 of the projection exposure apparatus shown in FIG. 4. Denoted in this Figure by character M is a mask having an integrated circuit pattern; by numeral 21, a reduction projection lens; by numeral 24, a wafer stage; and by character W, a wafer having a photosensitive surface layer and prealignment marks. The off-axis alignment scope includes two, a right-hand side alignment mark detecting system and a left-hand side alignment mark detecting system. The right-hand side alignment mark detecting system includes an objective lens 215; a cemented prism 216 having an internal reflection surface and a semitransparent reflection surface and being effective to combine an optical axis of an illumination system with an optical axis of a light-receiving system; a relay lens 217; an image-pickup lens 218; a mirror 219 for deflecting the optical path; an image pickup tube 220; an illuminating relay lens 221; a brightfield aperture stop 222; a dark-field aperture stop 223, the aperture stops 222 and 223 being interchangeably disposed on the illumination path; a condenser lens 224; and an optical fiber 225 for introducing an illuminating light from a light source.

The left-hand side alignment mark detecting system has a similar arrangement as of the right-hand side alignment mark detecting system, and the elements of the left-hand side alignment mark detecting system having functions corresponding to those of the elements of the right-hand side alignment mark detecting system are denoted by the same reference numerals with primes.

Figure 14B:
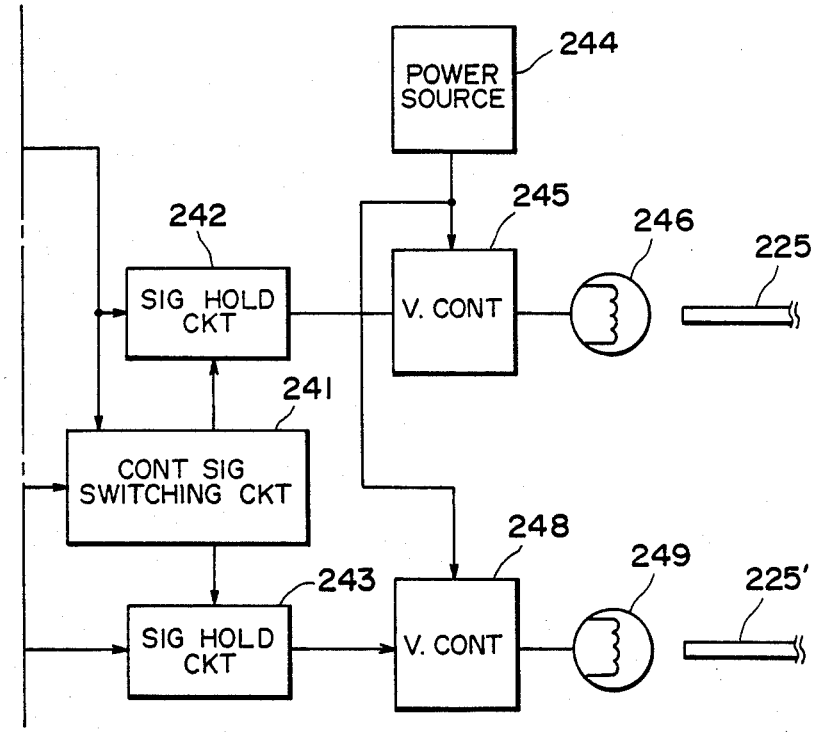
FIGS. 14A and 14B are diagrams showing a system for photoelectric detection, according to a fourth embodiment of the present invention.
Figure 14:
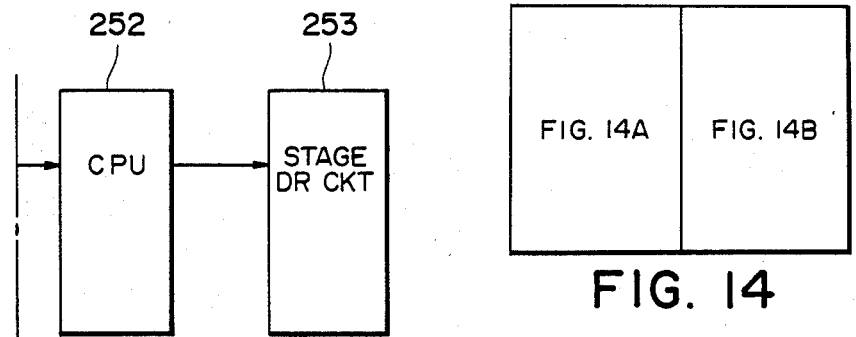
Figure 14A:
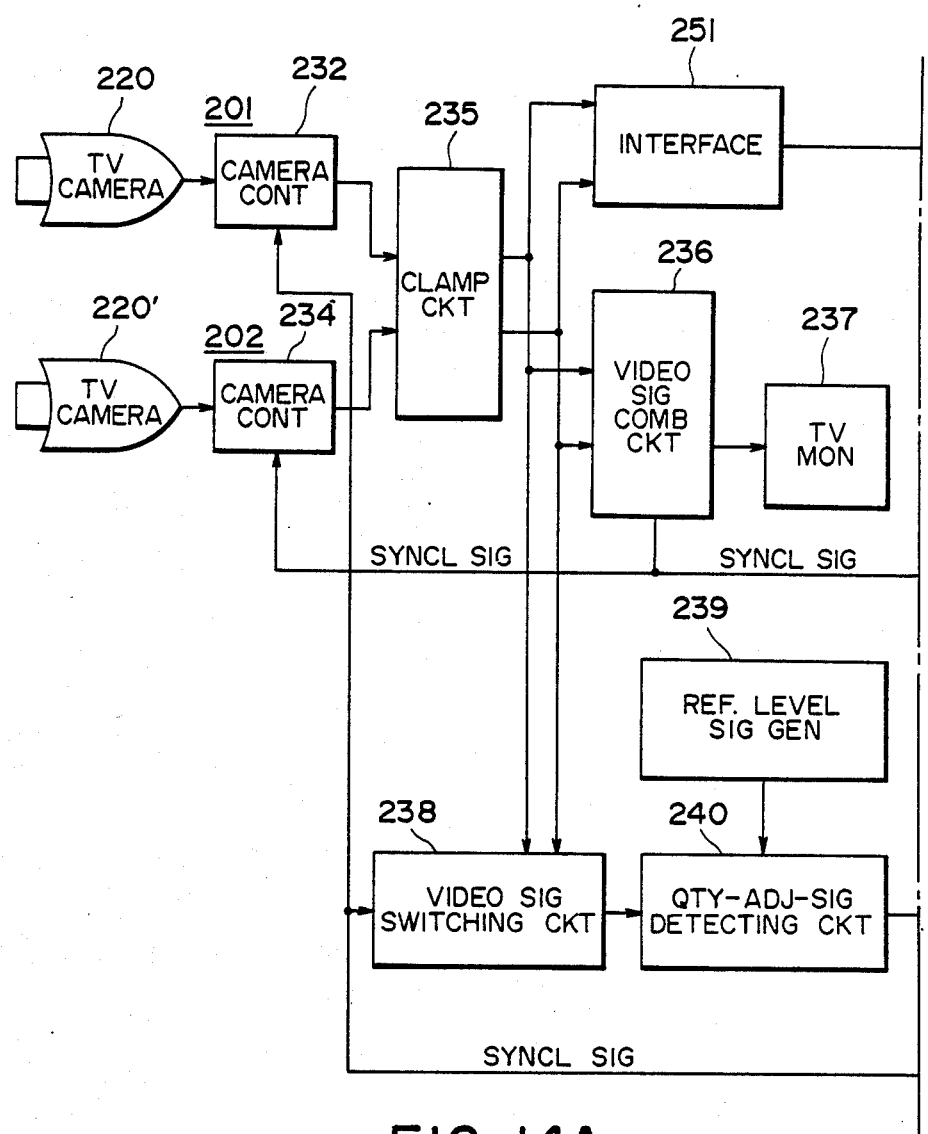

FIG. 14 is a block diagram showing a light-quantity adjusting circuit, arranged in accordance with the present invention. Denoted in this Figure by numerals 232 and 234 are TV camera control portions. Of these control portions, the camera control portion 232 together with the TV camera (image pickup tube) 220 constitute a right-hand side observing image-pickup portion 201, while the camera control portion 234 together with the TV camera (image pickup tube) 220 constitute a left-hand side observing image-pickup portion 202.

A clamp circuit 235 is adapted to secure the voltage of a pedestal for each of video signals outputted from the image-pickup portions 201 and 202. A video signal combining circuit 236 is adapted to combine the video signals of the TV camera control portions 232 and 234, the video signals being outputted from the clamp circuit 235, so that the images as picked up by the two cameras 220 and 220' can be observed in one picture plane. Also, the video signal combining circuit 236 produces a synchronization signal which is a reference timing signal for the present light-quantity adjusting circuit. A TV monitor 237 is connected to the video signal combining circuit 236. A video signal switching circuit 238 is arranged to receive the video signals from the right and left observing image-pickup portions 201 and 202, and is adapted to alternately outputs these video signals in response to the synchronization signal supplied from the video signal combining circuit 236. A reference level signal generating circuit 239 produces a reference level signal which is to be used as the reference for the signals from the image-pickup portions 201 and 202.

A light-quantity adjusting signal detecting circuit 240 is arranged to compare the output signal from the video signal switching circuit 238 with the reference level signal from the reference level signal generating circuit 239. In accordance with the difference between these signals, the light-quantity adjusting signal detecting circuit 240 produces a control signal for controlling the quantity of light, as will be described later. In this respect, the output signal of the video signal switching circuit 238 and the reference level signal of the reference level signal generating circuit 239 can be considered as being a "quantity adjusting signal". A control signal switching circuit 241 receives the control signal from the light-quantity adjusting signal detecting circuit 240 and, in response to the synchronization signal supplied thereto from the video signal combining circuit 236, outputs the control signal to a selected or corresponding one of signal holding circuit 242 and 243. The signal holding circuit 242 is operative in response to the synchronization signal supplied thereto from the video signal combining circuit 236 to sample an input signal supplied from the control signal switching circuit 241 and holds the input signal. The signal holding circuit 243 has a similar function as of the signal holding circuit 242, but the timing for the sampling and holding of the input signal is different. Denoted at 244 is a power source for supplying a voltage to each of voltage control circuits 245 and 248. The voltage control circuit 245 is adapted to determine an output voltage in accordance with an input signal supplied from the signal holding circuit 242 and outputs the determined output voltage to a lamp 246 which is, in this embodiment, a halogen lamp. The optical fiber 225 is effective to transmit the light emitted from the lamp 246 to the illumination system for the TV camera 220. The signal holding circuit 242, the voltage control circuit 245, the lamp 246 and the optical fiber 225 co-operate with each other to constitute a right-hand side illumination portion for observation.

The voltage control circuit 248 has a function similar to that of the voltage control circuit 245. Denoted at 249 is a lamp. The signal holding circuit 243, the voltage control circuit 248, the lamp 249 and the optical fiber 225' co-operate with each other to constitute a left-hand side illumination portion for observation. The opposite end of each of the optical fibers 225 and 225' is shown in FIG. 13.

An interface 251 is arranged to convert each of the video signals supplied thereto into a digital signal and outputs it to a central processing unit 252 (hereinafter the "CPU"). The CPU 252 is adapted to process the digital signal supplied from the interface 251 to control each of the units of the apparatus. Denoted at 253 is a stage driving circuit which is operative, in response to a control signal supplied thereto from the CPU 252, to move the wafer stage 24 (FIG. 4) in a plane perpendicular to the optical axis of the projection lens 21 so as to align the wafer W with respect to the mask M.

Figure 15:
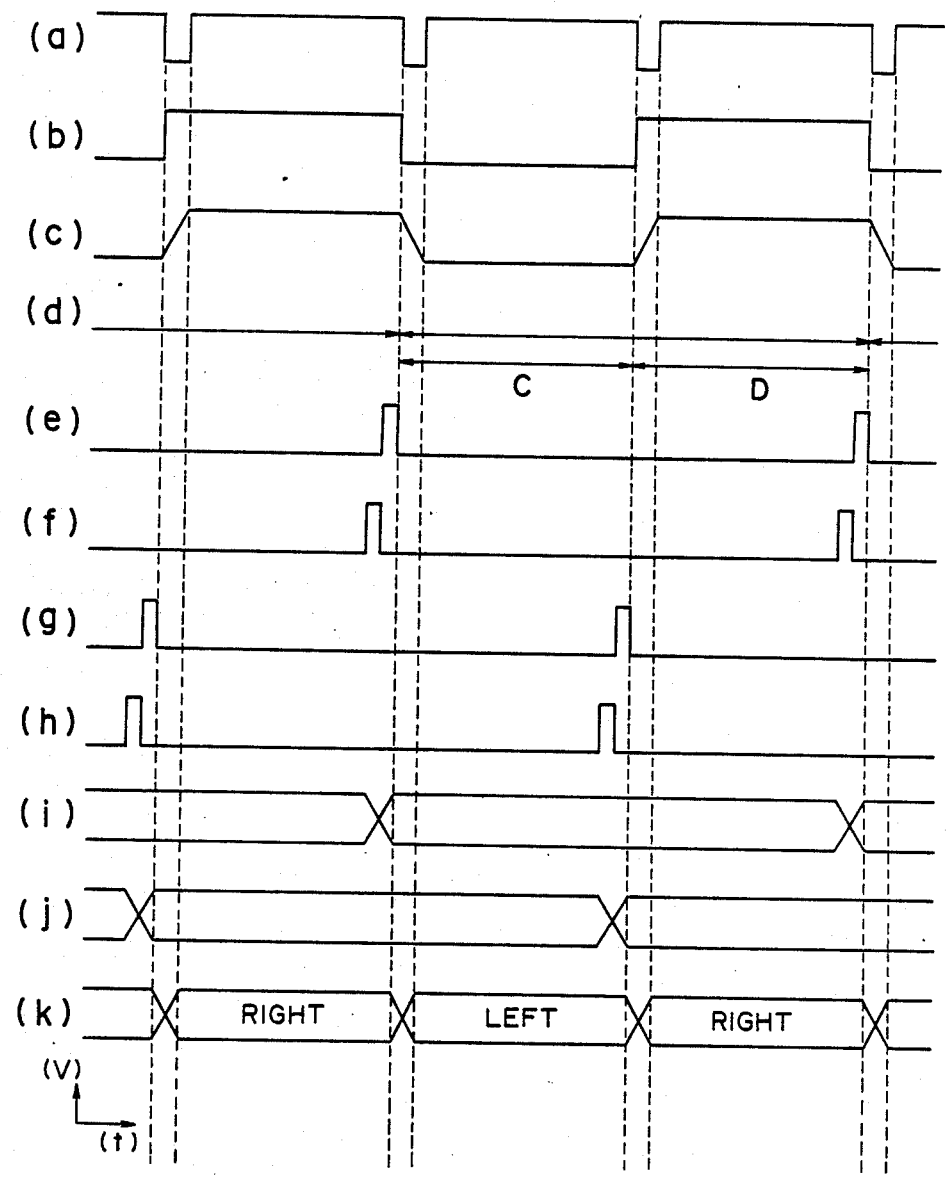
FIG. 15 is a timing chart of the fourth embodiment.

FIG. 15 is a timing chart showing various timings in the synchronization signal system of the FIG. 14 embodiment.

In FIG. 15, a part (a) shows the timing of vertical synchronization of the image-pickup portions 201 and 202; a part (b) shows the timing of field signals of the image-pickup portions 201 and 202; a part (c) shows the switching timing for each of the video signal switching circuit 238 and the control signal switching circuit 241; a part (d) shows the time period for displaying one complete picture image in the TV monitor 237; a part (e) shows the sampling timing in the signal holding circuit 242 of the right-hand side observation portion; a part (f) shows the timing of signal holding and releasing in the signal holding circuit 242; a part (g) shows the sampling timing in the signal holding circuit 243 of the left-hand side observation portion; a part (h) shows the timing of signal holding and releasing in the signal holding circuit 243; a part (i) shows the timing of the input signal relative to the voltage control circuit 245 of the right-hand side observation portion; a part (j) shows the timing of the input signal relative to the voltage control circuit 248 of the left-hand side observation portion; and a part (k) shows the timing in the light-quantity adjusting signal detecting circuit 240 for alternately processing the video signals of the two video signal systems. In each of the parts (e) and (g), the high level denotes the timing for sampling, while the low level denotes the timing for holding. In each of the parts (f) and (h), the high level denotes the timing of resetting.

In general, those used as the synchronization signals for the video signals are the vertical synchronization signal shown in the part (a) and the field signal shown in the part (b). Each of the signals shown in the parts (c) to (k) is formed on the basis of the above-described two signals shown in the parts (a) and (b).

The timings shown in FIG. 15 will be described in more detail.

Generally, the vertical synchronization signal of the synchronization signal system in the image-pickup portion of 2:1 interlace type is such as shown in the part (a) of FIG. 15. Also, the field signal of the synchronization signal system is such as shown in the part (b) of this Figure. In the image-pickup portion of 2:1 interlace type, one picture plane is divided into two fields of odd-ordinal-number scan lines (1st scan line, 3rd scan line . . . ) and even-ordinal-number scan lines (2nd scan line, 4th scan line . . . ). For example, in the part (d) of FIG. 15, the period C corresponds to the scan along the odd-ordinal-number scan lines, while the period D corresponds to the scan along the even-ordinal-number scan lines. In order to obtain information for one picture plane, signals contained in both the regions C and D are processed.

As regards the scan along the odd-ordinalnumber scan lines, the scan is made in a skip-scan manner, skipping over each of the even-ordinal-number scan lines, in a direction from the above to the below of the picture plane. At this time, however, the signal level of the video signal obtained in relation to the scan along the odd-ordinal-number scan lines is approximately equal to the signal level in relation to the even-ordinal-number scan lines. This means that, only by measuring either of the signal levels related to the odd-ordinal-number scan lines and the even-ordinal-number scan lines, the signal level for one complete picture plane can be detected.

In this embodiment of the present invention, the signal level related to the odd-ordinal-number scan lines in one picture plane of the TV camera of the left-hand side observation system is used as the control signal for controlling or adjusting the quantity of light for the left-hand side observation system, whereas the signal level related to the even-ordinal-number scan lines in one picture plane of the TV camera of the right-hand side observation system is used as the control signal for controlling or adjusting the quantity of light for the right-hand side observation system.

The operation of the FIG. 14 arrangement will now be described, taken in conjunction with FIG. 15.

The video signal from the TV camera 220 is supplied via the control portion 232 to the clamp circuit 235. Simultaneously therewith, the video signal from the TV camera 220' is supplied via the control portion 234 to the clamp circuit 235. In this clamp circuit 235, the pedestals of the video signals are adjusted to the same level. Output signals from the clamp circuit 235 are applied to the video signal combining circit 236. The video signal combining circuit 236 processes these signals so as to display, in one complete picture plane, both the signal from the right-hand side observation system and the signal from the left-hand side observation system. A video signal obtained by this combination is applied to the TV monitor 237.

Also, the video signals from the clamp cicuit 235 are applied to the video signal switching circuit 238. The video signal switching circuit 238 selects, in response to the synchronization signal supplied thereto from the video signal combining circuit 236, one of the video signals from the image-pickup portions 201 and 202 at a timing shown in the part (c) of FIG. 15. The selected video signal is supplied to the light-quantity adjusting signal detecting circuit 240. The light-quantity adjusting signal detecting circuit 240 processes the thus inputted video signal and compares the level of the input video signal with the reference level of the reference level signal applied thereto from the reference level signal generating circuit 239. In accordance with the difference in the signal level between the two signals, the light-quantity adjusting signal detecting circuit 240 produces a control signal. The control signal outputted from the light-quantity adjusting signal detecting circuit 240 is applied to the control signal switching circuit 241 and, then, is supplied to one of the signal holding circuits 242 and 243 at the same timing as of the video signal switcing circuit 238. On the basis of the synchronization signal supplied from the video signal combining circuit 236, the signal holding circuit 242 produces signals of timings such as shown in the parts (e) and (f) of FIG. 15. The signal holding circuit 242 releases, at the timing (f), the signal which the signal holding circuit 242 has held, and then holds a new signal at the timing (e).

The signal holding circuit 243 functions in a similar manner as the signal holding circuit 242. But, the signal holding and the signal releasing are effected at the timings (g) and (h) shown in FIG. 15 which are deviated, with respect to time, by an amount corresponding to a half of one picture plane. The output signal of the signal holding circuit 242 at that time is shown in the part (i) of FIG. 15, while the output signal of the signal holding circuit 243 is shown in the part (j) of this Figure.

The output signal of each of the signal holding circuits 242 and 243 is supplied to an associated one of the voltage control circuits 245 and 248, whereby a voltage corresponding to the control signal is outputted. By this voltage, the quantity of light to be emitted from an associated one of the lamps 246 and 249 is optimized and, therefore, the image quality of the picture image in the TV monitor 237 is improved significantly.

Upon completion of optimization as above, the outputs from the clamp circuit 235 are applied to the interface 251, so that they are processed in the CPU 252. The output of the CPU 252 is supplied to the stage driving circuit 253 to thereby drive the wafer stage 24 (FIG. 4). Since the output video signals from the clamp circuit 235 corresponding to the right and left observation systems have the same level, the signal processing in the interface 251 and in the CPU 252 can be effected in a simple manner.

Figure 16B:
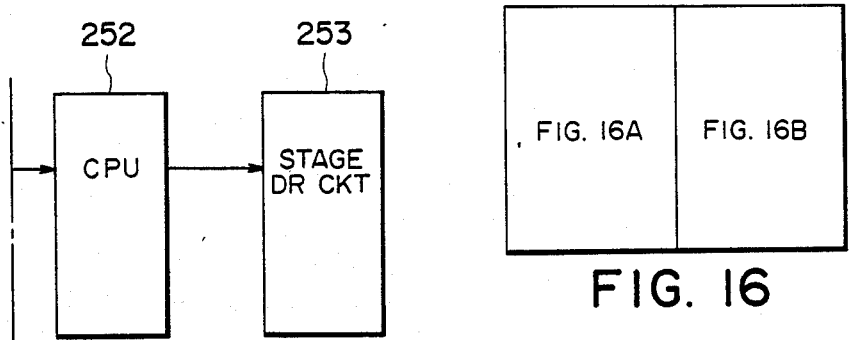
FIGS. 16A and 16B are diagrams showing a system for photoelectric detection, according to a fifth embodiment of the present invention.
Figure 16B:
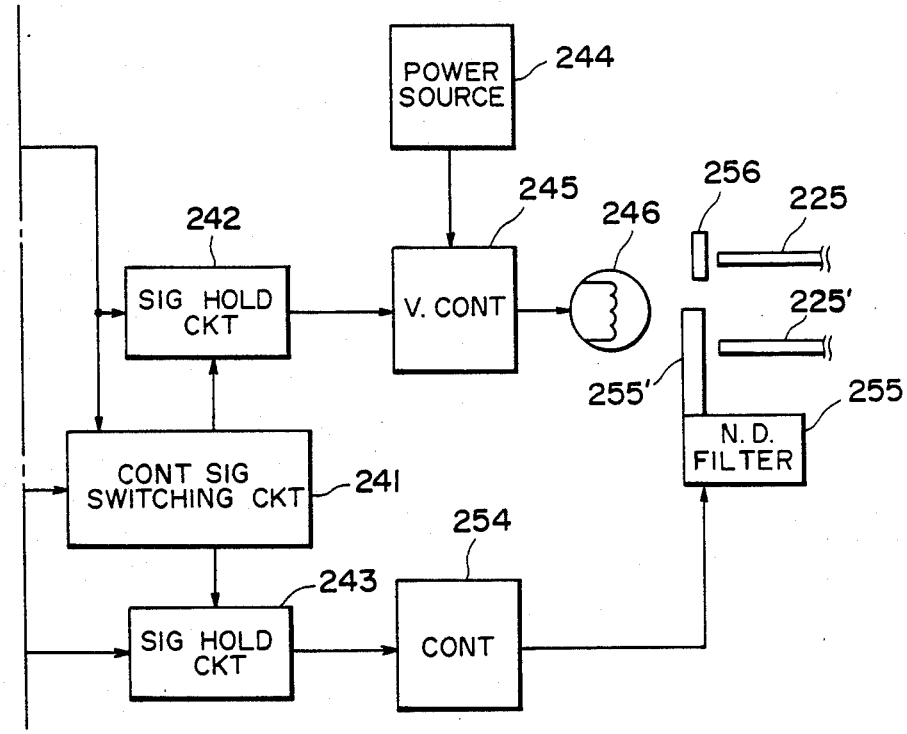
Figure 16A:
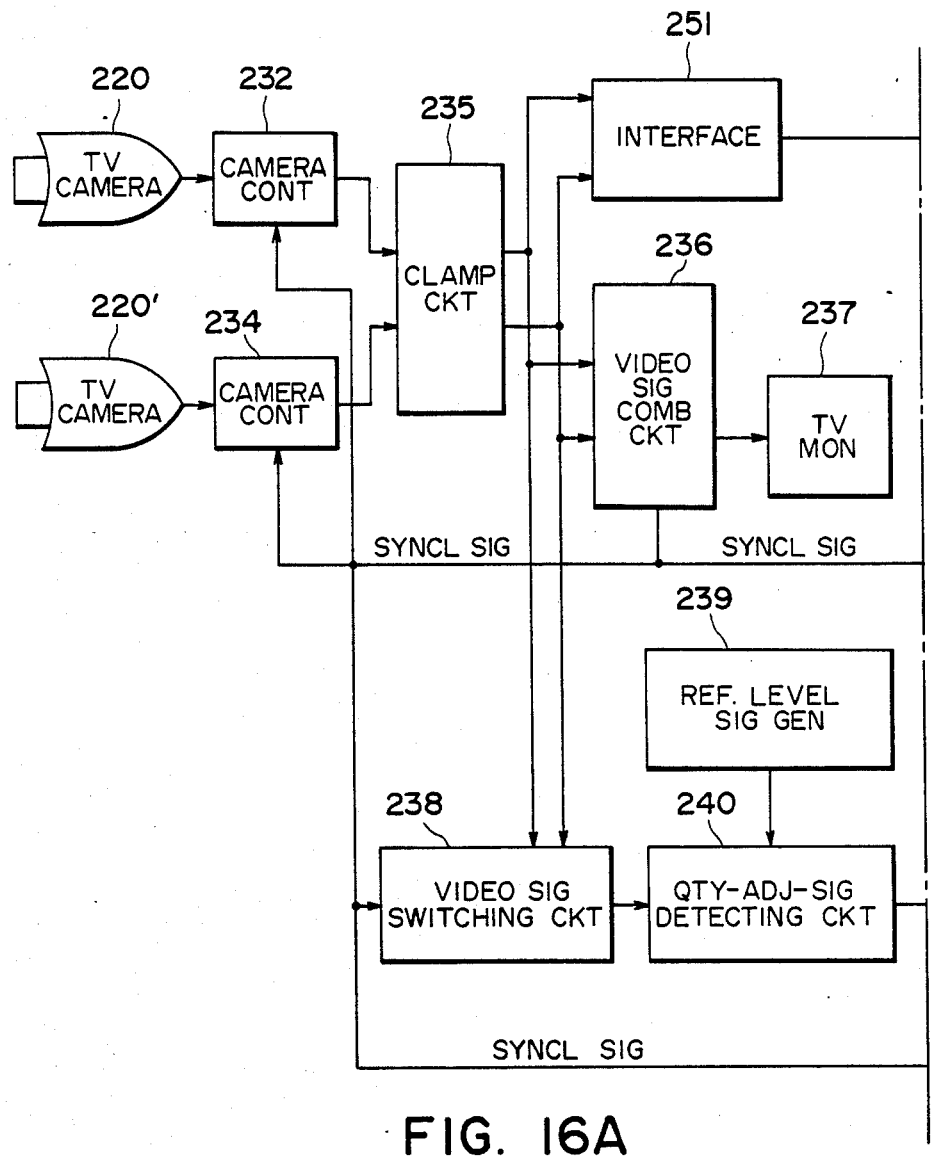

While this embodiment uses the same number of light-sources as that of the image-pickup portions, if it is desired to use a single light-source, the system may be modified such as shown in FIG. 16.

In FIG. 16, the elements denoted by numerals 232–253 have substantially the same functions as those of the corresponding elements of FIG. 14. Denoted at 254 in FIG. 16 is a control portion for producing a voltage in accordance with a control signal supplied thereto from a signal holding circuit 243. The system further includes a neutral density filter portion (hereinafter the "ND filter portion") having a neutral density filter 255' (hereinafter the "ND filter") and a motor (not shown) for driving the ND filter 255'.

The ND filter 255' of the ND filter portion 255 is disposed between a light source 246 and an optical fiber 225'. By moving the ND filter 255' through the unshown motor of the ND filter portion 255, the quantity of light to be transmitted to the optical fiber 225' is changed. Denoted at 256 is another ND filter.

The operation of the FIG. 16 system is substantially the same as that of the FIG. 14 arrangement, except for the point that the voltage produced by the control portion 254 is used to drive the motor of the ND filter portion 255 to move the ND filter 255', to thereby control the quantity of light.

The above-described ND filter 256 is provided for the following reasons:

If a single light source is used, it is not always possible to control, simultaneously, the amount of irradiation relative to each of plural locations on the same object. This is true, particularly when the quantity of light transmitted through the optical fiber 225 is greater than that transmitted through the optical fiber 225'. That is, in such case, the quantity of light to be introduced to the optical fiber 225' could not be made larger than that to be introduced to the optical fiber 225, even if the lamp 246 and/or the ND filter portion 255 are adjusted. In order to obviate such incovenience, the ND filter 256 is disposed between the light source 246 and the optical fiber 225. In this embodiment, the ND filter 256 has a transmission factor of an order of 60%, while the ND filter 255' of the ND filter portion 255 has a variable transmission factor, which is continuously variable in a range from approximately 10% to approximately 85%. Owing to the addition of the ND filter 256, the quantity of light to be transmitted through the optical fiber 225 can be changed within a range of 10/60–85/60 of the quantity of light to be transmitted through the optical fiber 225'. This assures that, even if the voltage to be applied to the lamp 246 is adjusted so as to achieve optimization of the quantity of light passing through the optical fiber 225, the quantity of light to be introduced to the optical fiber 225' is adjusted as desired by means of the ND filter portion 255. Thus, the aforementioned inconvenience is removed fully.

Figure 17:
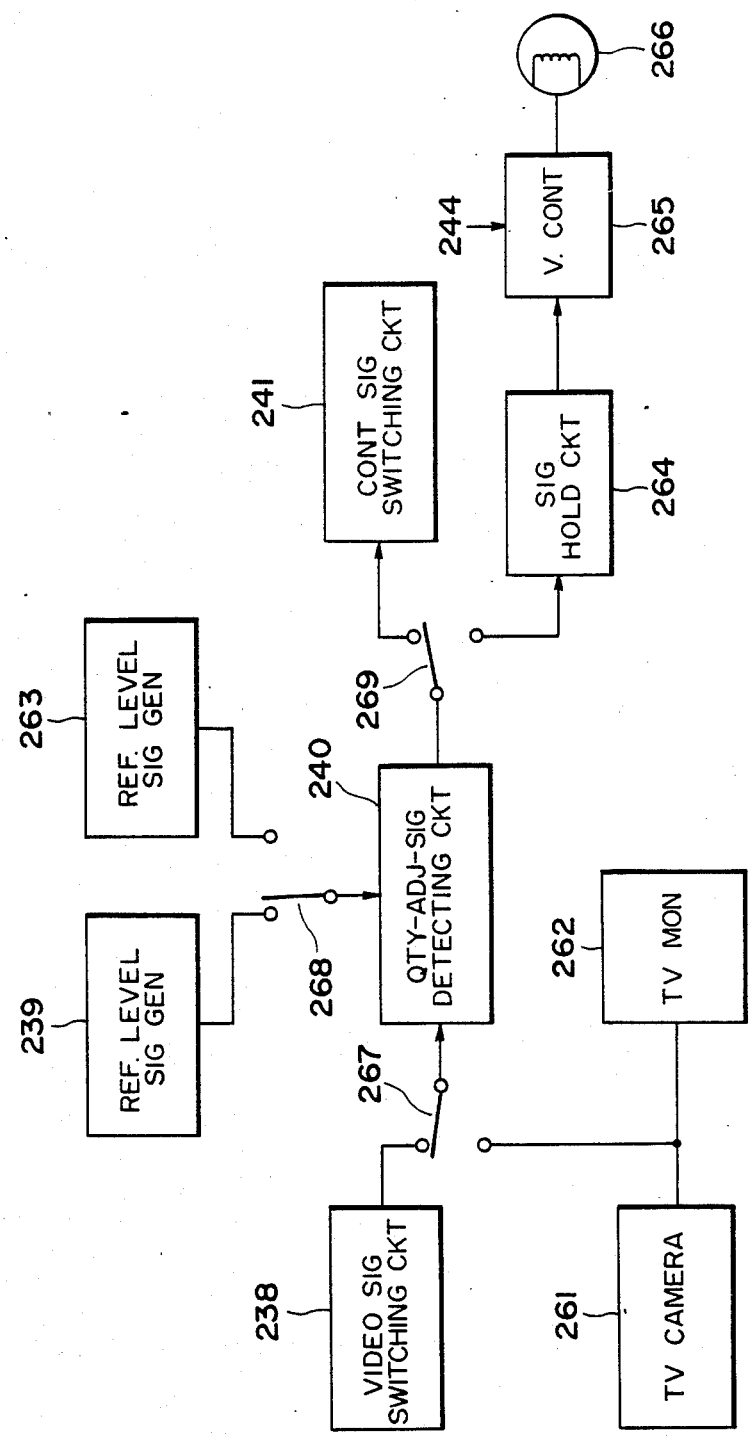
FIG. 17 is a diagram showing a system for photoelectric detection, according to a sixth embodiment of the present invention.

Referring now to FIG. 17, a system for photoelectric detection according to a further embodiment of the present invention will be described. In FIG. 17, the elements as denoted by numerals 238–241 have substantially the same function as those of corresponding elements of the FIG. 14 embodiment.

As shown in FIG. 17, the system includes an image-pickup portion (TV camera) 261 of an observation optical system for observing the wafer W located at the fine alignment station; a TV monitor 262 connected to the image-pickup portion 261; a reference level signal generating circuit 263 for setting the level of video signals to be supplied to the TV monitor 262 from the image-pickup portion 261; a signal holding circuit 264 for holding, in accordance with the level of the video signal outputted from the image-pickup portion 261, a light-quantity control signal produced by a light-quantity adjusting signal generating circuit 240. The system further includes a voltage control circuit 265 which is power-supplied from a power source 244 and outputs a voltage corresponding to the light-quantity control signal supplied thereto from the signal holding circuit 264. Denoted at 266 is a lamp for illuminating the pickup field of the image-pickup portion 261.

There are provided switches 267–269 which are operationally associated with each other. Similarly to the video signal switching circuit 238 and the control signal switching circuit 241, each of the switches 267–269 may be actuated in response to a video synchronization signal or any other switching signal (e.g. a switching signal associated with the unit of frame) synchronized with the video synchronization signal. Alternatively, the switches 267–269 may be arranged so that they are in the illustrated positions when the wafer stage 24 (FIG. 4) is at the prealignment station, while they are moved to the other positions (not shown) when the wafer stage 24 is at the exposure station or the fine alignment station. Each of the switches 267–269 may be an electronic switch, similar to the video signal switching circuit 238 and the control signal switching circuit 241. If, however, time sharing for too very long time periods is desired, such as in the case where each switch should be actuated in accordance with the change in the position of the wafer stage (e.g. movement thereof to the fine alignment station from the prealignment station), each switch may be a mechanical switch operable in association with movement of the wafer stage 24.

In this embodiment, the elements as denoted by numerals 261-266 have substantially the same structures and functions as of those of the correspoding elements (those entitled similarly) of the FIG. 14 embodiment or the FIG. 16 embodiment.

While, in the FIG. 14 embodiment and in the FIG. 16 embodiment, the control of the light quantity is performed for a case where the video signals from detecting optical systems of the same detection system are simultaneously displayed in the same monitor. However, this is not limiting. That is, as has been described with reference to the FIG. 17 embodiment, it is possible to control the amount of irradiation in each of completely different signal detecting systems, even if they are contained in separate apparatuses, with the use of the same light-quantity control signal detecting circuit such as 240 in FIG. 17.

Although some embodiments of the present invention have been described with reference to a case where signals of 2:1 interlace system are used, the present invention is not limited thereto. That is, non-interlace signals may be used. In such case, vertical synchronization signals of a synchronization signal system will be used to provide timing signals such as shown in FIG. 15. By this, the quantity of light can be adjusted with such a structure as shown in FIGS. 14, 16 or 17.

As described, the light-quantity adjusting means of the present invention assures, in a case where the photoelectric detection device has plural image-pickup portions, prevention of degradation of image quality of the picture image in a common display and correction relative to the difference in appearance due to the conditions of an object, being examined, as well as correction in relation to the illumination system. In addition, the light-quantity adjusting circuit for controlling plural light sources can be of simple and compact structure. Moreover, the adjustment of the light-quantity is achieved by processing the signals with the same circuit. This is effective to prevent uneven adjustment for the signal level due to any difference in the characteristics of plural light-quantity adjusting circuits.

Further, with the use of a single light-quantity adjusting circuit, control of the level of video signals is attainable relative to each of separate signal detecting systems. Therefore, the whole structure of the apparatus can be simplified which assures reduction in size of the apparatus as well as reduction in the manufacturing cost.

While, in each of the foregoing embodiments, the invention has been described with reference to an alignment system in a semiconductor exposure apparatus, the invention is not limited thereto. For example, the photoelectric detection system of the present invention is applicable to an observation apparatus such as a pattern recognition apparatus.

The image pickup device used in the foregoing embodiments as the light-receiving portion may be replaced by any other light-receiving element such as a photoelectric converting element, e.g. a photo-transistor.

In the embodiment in which the voltage to be supplied to the light source is changed to adjust the amount of irradiation, an ND filter having a variable transmission factor, a polarizing plate or any other suitable means for physically changing the amount of irradiation may be disposed in the path of irradiation, in place of controlling the voltage to be applied to the light source. In such case, the adjustment of irradiation may be effected by controlling a pulse motor or the like connected to the ND filter or the polarizing plate.

In the embodiment using the ND filter, this filter may be so disposed as to act on the reflection light from the wafer W, rather than the light impinging on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A system for photoelectrically detecting an object, comprising:
   means for illuminating the object;
   means for photoelectrically detecting the object being illuminated by said illuminating means, said detecting means producing an output in response to the detection;
   means for controlling light to be directed, by way of the object, to said detecting means from said detecting means; and
   means for processing the output produced by said detecting means upon or after completion of the controlling operation performed by said controlling means.

2. A system according to claim 1, wherein said illuminating means includes a light source and wherein said controlling means is adapted to control emission of light by said light source.

3. A system according to claim 1, wherein said controlling means is adapted to produce a completion signal in response to the completion of the controlling operation of the light and wherein said processing means includes a switching circuit operable in response to the completion signal from said controlling means.

4. A system for photoelectrically detecting an object, comprising:
   means for reading information related to an optical property of the object when it is at a first position;
   means for illuminating the object when it is at a second position;
   means for photoelectrically detecting the object being illuminated by said illuminating means at the second position; and
   means for controlling light to be directed, by way of the object, to said detecting means from said illuminating means, in accordance with the information read by said reading means.

5. A system according to claim 4, wherein said reading means is adapted to read information related to reflectance of the object.

6. A system according to claim 5, wherein said reading means includes a light source and a sensor for sensing light emitted from said light source and reflected by the object.

7. A system according to claim 4, wherein said illuminating means includes a light source and wherein said controlling means is adapted to control light emitted by said light source.

8. A system according to claim 4, wherein said illuminating means includes a laser and wherein said controlling means includes a polarizing plate.

9. A system for photoelectrically detecting an object, comprising:
- means for irradiating the object with light of a predetermined intensity;
- means for photoelectrically detecting the object being irradiated by said irradiating means, said detecting means producing an output signal in response to the detection;
- means for amplifying the output signal from said detecting means; and
- means for variably controlling the intensity of light from said irradiating means and a rate of the amplification of said amplifying means so that said amplifying means produces a predetermined output.

10. A system according to claim 9, further comprising means for discriminating a position of the object on the basis of the output of said amplifying means.

11. A system for photoelectrically detecting an object having first and second portions, comprising:
- first and second illuminating means for illuminating the first and second portions of the object, respectively;
- first and second image-pickup means for photoelectrically detecting, respectively, the first and second portions of the object illuminated by said first and second illuminating means, respectively, and for producing first and second video signals, respectively, corresponding to images of the first and second portions of the object, respectively;
- display means for receiving said first and second video signals from said first and second image-pickup means and for displaying the images of the first and second portions of the object; and
- control means for controlling light to be directed, by way of the first portion of the object, to said first image-pickup means from said first illuminating means and light to be directed, by way of the second portion of the object, to said second image-pickup means from said second illuminating means, said control means being adapted to process said first and second video signals from said first and second image-pickup means in a time-sharing fashion so that the control of the light to be directed to said first image-pickup means and the control of the light to be directed to said second image-pickup means are executed independently of each other.

12. A system according to claim 11, wherein each of said first and second illuminating means includes a light source and wherein said control means is arranged to control emission of light by at least one of the light sources of said first and second illuminating means.

13. A system according to claim 11, wherein at least one of said first and second illuminating means includes a filter having a variable transmission factor and wherein said control means is adapted to change the transmission factor of said filter.

14. A system according to claim 11, wherein each of said first and second image-pickup means includes an image-pickup portion and wherein said control means is adapted to process a component of said first video signal that corresponds to odd numbered scan lines with respect to said image-pickup portion of said first image-pickup means, and to image-pickup portion of said second image-pickup means.

15. A system according to claim 11, wherein each of said first and second video signals includes signal portions and wherein said control means includes a processing circuit adapted to process said signal portions of said first and second video signals alternately, said processing circuit producing, each time it processes one of said signal portions of said first video signal, a first control signal in accordance with the processing of the one signal portion, said processing circuit also producing, each time it processes one of said signal portions of said second video signal, a second control signal in accordance with the processing of the one signal portion of said second video signal, and said control means further including a first sample and hold circuit for sampling and holding said first control signal and a second sample and hold circuit for sampling and holding said second control signal.

16. A system for photoelectrically detecting an object, comprising:
- means for moving the object to first and second positions;
- first and second illuminating means for illuminating the object when it is at the first and second positions, respectively;
- first and second detecting means for photoelectrically detecting the object when it is at the first and second positions, respectively;
- control means operable to control light directed, by way of the object, to said first detecting means from said first illuminating means in accordance with a first detection signal outputted from said first detecting means, and operable to control light directed, by way of the object, to said second detecting means from said second illuminating means in accordance with a second detection signal outputted from said second detecting means; and
- means for transmitting the first detection signal of said first detecting means to said control means when the object is at the first position and for transmitting the second detection signal of said second detecting means to said control means when the object is at the second position.

17. A system according to claim 16, further comprising means for relatively coarsely aligning the object on the basis of the first detection signal and for relatively finely aligning the object on the basis of the second detection signal.

* * * * *

UNITED STATES PATENT AND TRADEMARK OFFICE
CERTIFICATE OF CORRECTION

PATENT NO. : 4,694,186
DATED : September 15, 1987
INVENTOR(S) : RURI ONODA, ET AL.

It is certified that error appears in the above-identified patent and that said Letters Patent is hereby corrected as shown below:

COLUMN 1

Line 61, "displaced" should read --displayed--.

COLUMN 2

Line 49, "disadvantage" should read --disadvantageous--.
Line 67, "each" should read --such--.

COLUMN 14

Line 43, "circit 236." should read --circuit 236.--.

COLUMN 18

Lines 25-26, "detecting" should read --illuminating--.

UNITED STATES PATENT AND TRADEMARK OFFICE
CERTIFICATE OF CORRECTION

PATENT NO. : 4,694,186

DATED : September 15, 1987

INVENTOR(S) : RURI ONODA, ET AL.

It is certified that error appears in the above-identified patent and that said Letters Patent is hereby corrected as shown below:

COLUMN 20

Line 5, "odd numbered" should read --odd-numbered--.

Line 7, "to image-pickup" should read --to process a component of said second video signal that corresponds to even-numbered scan lines with respect to said image-pickup--.

Signed and Sealed this

Twenty-ninth Day of March, 1988

Attest:

DONALD J. QUIGG

Attesting Officer

Commissioner of Patents and Trademarks